United States Patent
Matsumoto et al.

(10) Patent No.: US 11,503,231 B2
(45) Date of Patent: Nov. 15, 2022

(54) IMAGING DEVICE, IMAGING SYSTEM, AND MOVING BODY

(71) Applicant: CANON KABUSHIKI KAISHA, Tokyo (JP)

(72) Inventors: Kohei Matsumoto, Tokyo (JP); Hirofumi Totsuka, Fujisawa (JP); Katsuhito Sakurai, Machida (JP); Kohichi Nakamura, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/088,450

(22) Filed: Nov. 3, 2020

(65) Prior Publication Data

US 2021/0051282 A1    Feb. 18, 2021

Related U.S. Application Data

(63) Continuation of application No. 16/144,783, filed on Sep. 27, 2018, now Pat. No. 10,855,940.

(30) Foreign Application Priority Data

Sep. 29, 2017  (JP) .............. JP2017-192051
Jul. 19, 2018   (JP) .............. JP2018-136001

(51) Int. Cl.
*H04N 5/355* (2011.01)
*H04N 5/369* (2011.01)
(Continued)

(52) U.S. Cl.
CPC .... *H04N 5/35554* (2013.01); *B60W 30/0956* (2013.01); *H01L 27/14634* (2013.01); *H04N 5/3535* (2013.01); *H04N 5/374* (2013.01); *H04N 5/376* (2013.01); *H04N 5/379* (2018.08); *H04N 5/3742* (2013.01); *H04N 5/3765* (2013.01); *B60W 2420/42* (2013.01)

(58) Field of Classification Search
CPC ....... H04N 5/35554; H04N 5/335–379; H04N 5/3535; H04N 5/35545; H04N 5/35563; H01L 27/14634; H01L 27/14636; H01L 27/14638
See application file for complete search history.

(56) References Cited

U.S. PATENT DOCUMENTS

2017/0150076 A1   5/2017  Hizi
2017/0195604 A1   7/2017  Shen
(Continued)

FOREIGN PATENT DOCUMENTS

| EP | 2 889 908 A1 | 7/2015 |
|---|---|---|
| JP | 2012-175234 A | 9/2012 |
| JP | 2015-103998 A | 6/2015 |

*Primary Examiner* — Paul M Berardesca
(74) *Attorney, Agent, or Firm* — Canon U.S.A., Inc. IP Division

(57) ABSTRACT

An imaging device includes a first chip on which a plurality of first blocks is arranged in a matrix, and a second chip which includes a first block scanning circuit and a second block scanning circuit. The second chip includes a selection circuit configured to select driving timing given to a plurality of pixels, based on a signal output from the first block scanning circuit and a signal output from the second block scanning circuit. A second block includes a circuit other than the selection circuit.

16 Claims, 14 Drawing Sheets

(51) Int. Cl.
    *H04N 5/353*     (2011.01)
    *H04N 5/374*     (2011.01)
    *H04N 5/376*     (2011.01)
    *H01L 27/146*     (2006.01)
    *B60W 30/095*     (2012.01)

(56) References Cited

U.S. PATENT DOCUMENTS

2018/0227514 A1*   8/2018   Takahashi .............. H04N 5/379
2020/0068147 A1*   2/2020   Hayashi ............... H04N 5/3535
2020/0099880 A1*   3/2020   Kobayashi ........... H04N 5/3535

* cited by examiner

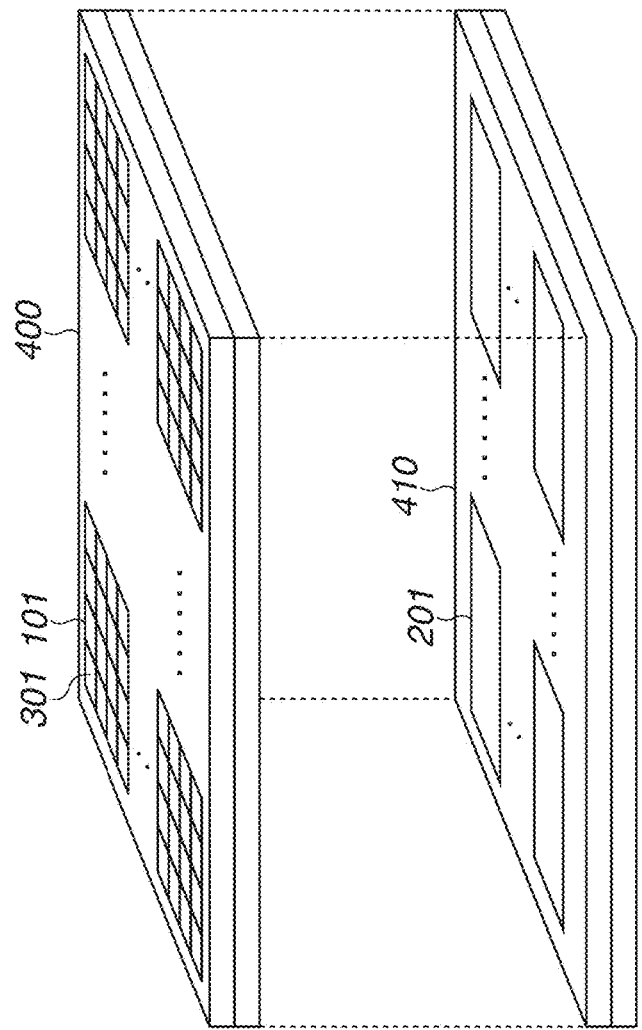
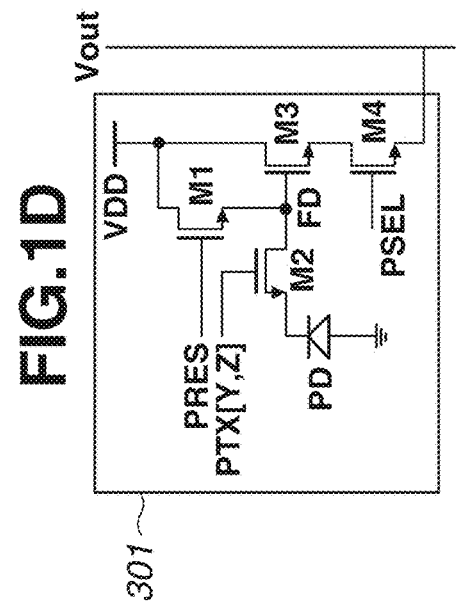
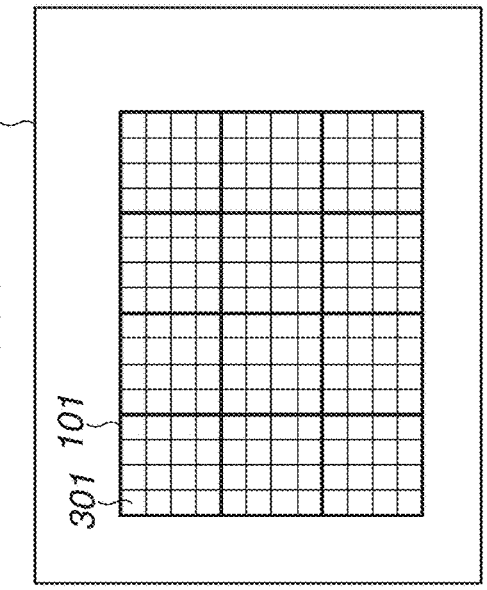
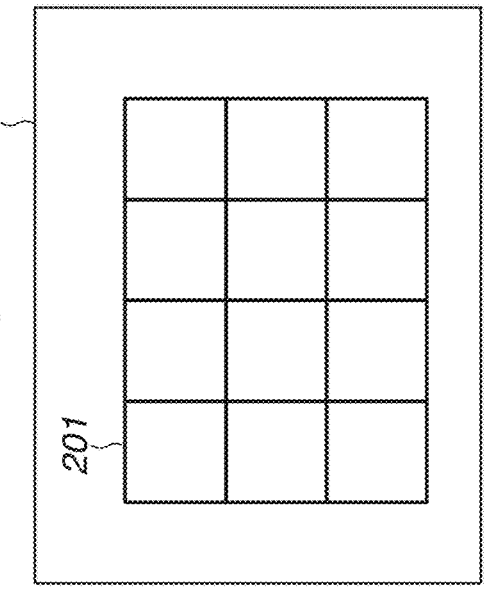

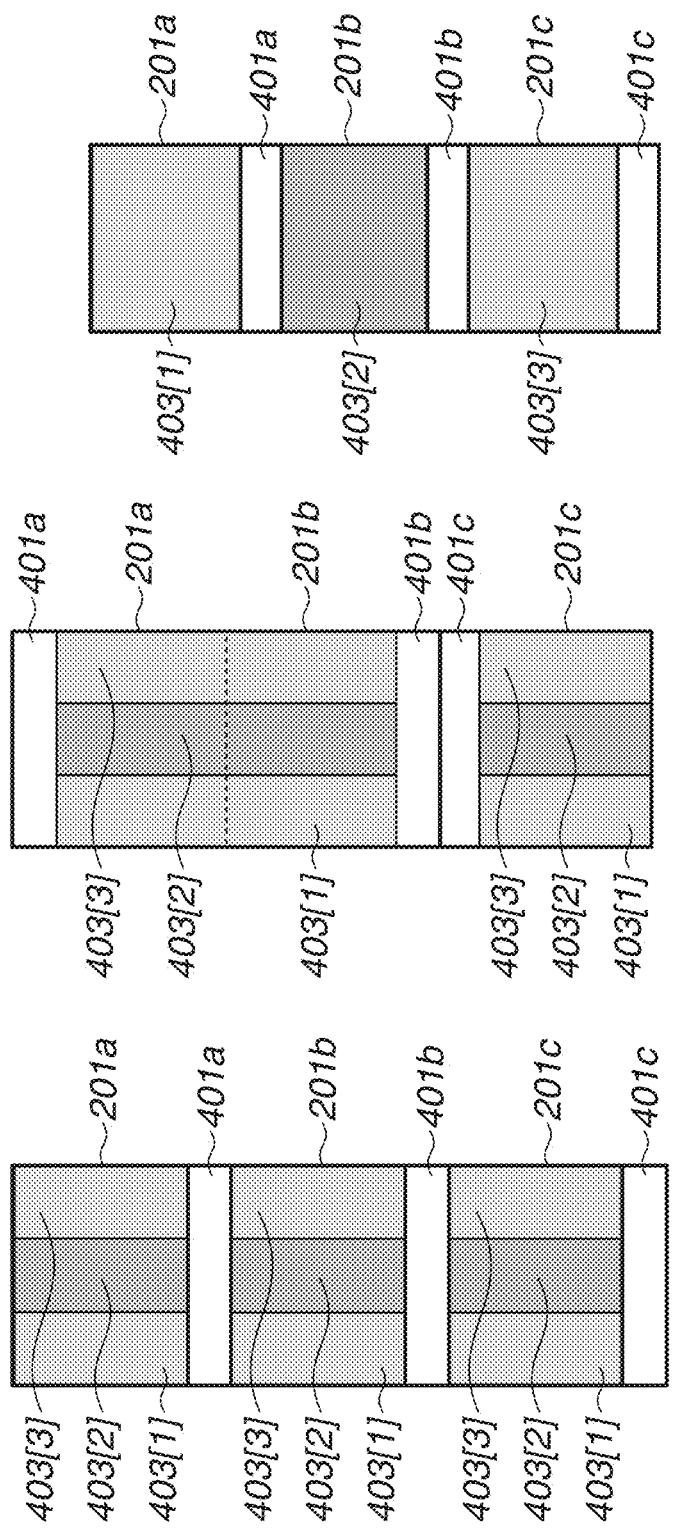

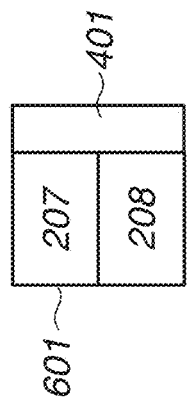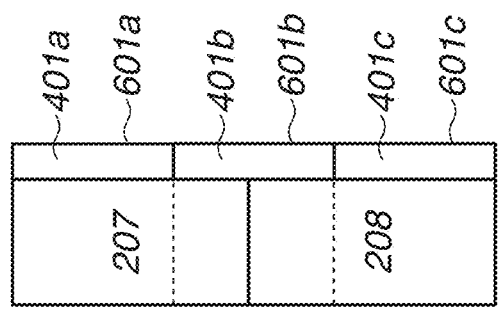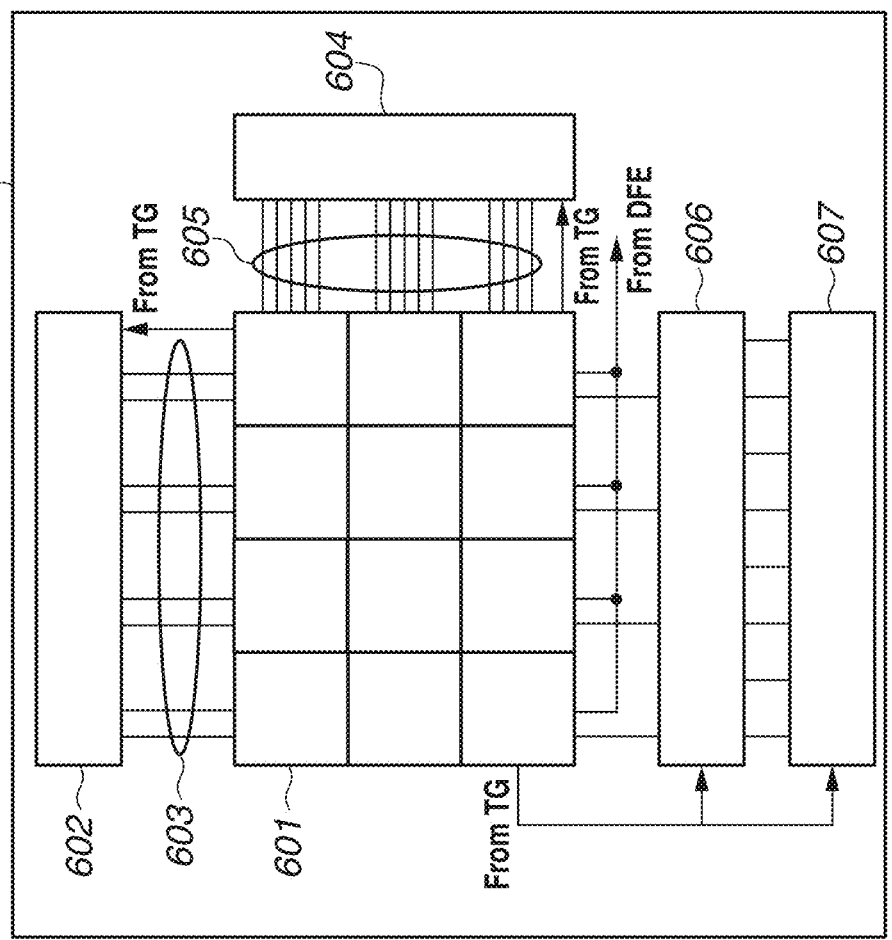

FIG.13B
FRONT VIEW
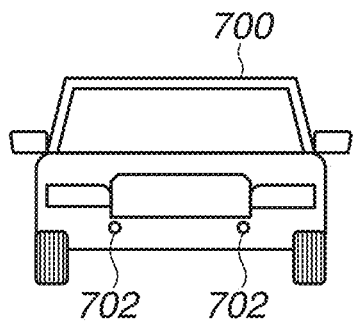
TOP VIEW
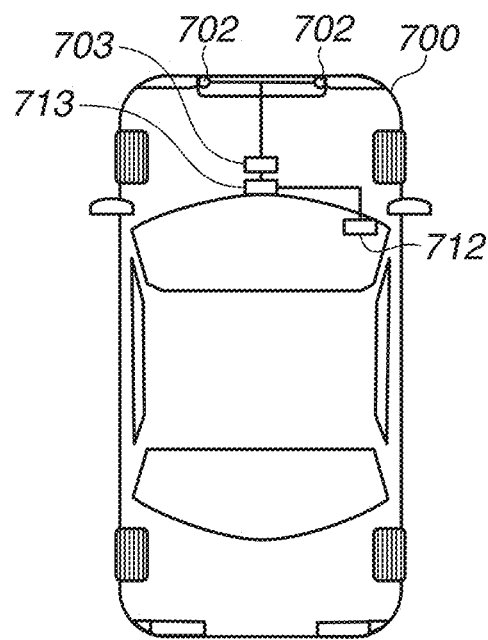
REAR VIEW
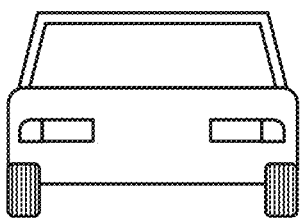

IMAGING DEVICE, IMAGING SYSTEM, AND MOVING BODY

CROSS-REFERENCE TO RELATED APPLICATION

This application is a Continuation of U.S. application Ser. No. 16/144,783, filed Sep. 27, 2018, which claims the benefit of Japanese Patent Applications No. 2017-192051, filed Sep. 29, 2017, and No. 2018-136001, filed Jul. 19, 2018, which are hereby incorporated by reference herein in their entireties.

BACKGROUND OF THE INVENTION

Field of the Invention

The present invention relates to an imaging device, an imaging system, and a moving body.

Description of the Related Art

Japanese Patent Application Laid-Open No. 2012-151847 discusses a device which includes a plurality of pixels, an analog-to-digital (AD) conversion unit, and a row selection block provided on a first chip, and driving circuits for controlling charge accumulation time of the plurality of pixels provided on a second chip. Specifically, according to Japanese Patent Application Laid-Open No. 2012-151847, a plurality of pixels 18 is provided on a first chip 12, and generation elements 28 of actuation signals are provided on a second chip 14. The generation circuits 28 of the actuation signals are electrically connected to electrical connections 38. The electrical connections 38 are input to the gates of transfer transistors 56 or reset transistors 46 provided in the pixels 18. The generation circuits 28 of the actuation signals can thereby control the charge accumulation time of charges generated by photoelectric conversion. Japanese Patent Application Laid-Open No. 2012-151847 also discusses that the generation circuits 28 of the activation signals are provided for respective pixel groups (pixel blocks) each including a plurality of pixels.

Japanese Patent Application Laid-Open No. 2012-151847 only discusses providing the pixel groups with the corresponding generation circuits of the activation signals on the second chip.

The present invention is directed to providing an imaging device of improved performance, compared to that of Japanese Patent Application Laid-Open No. 2012-151847.

SUMMARY OF THE INVENTION

According to an aspect of the present invention, an imaging device includes a first chip on which a plurality of first blocks is arranged in a matrix, and a second chip on which a plurality of second blocks is arranged in a matrix, the first and second chips being stacked, wherein each of the plurality of first blocks includes a plurality of pixels arranged in a matrix, wherein each of the plurality of second blocks includes a selection circuit configured to select driving timing of the plurality of pixels belonging to each of the plurality of first blocks, and wherein each of the plurality of second blocks includes a signal processing unit configured to process signals output from the pixels.

According to another aspect of the present invention, an imaging device includes a first chip on which a plurality of first blocks is arranged in a matrix, and a second chip on which a plurality of second blocks is arranged in a matrix, the first and second chips being stacked, wherein each of the plurality of first blocks includes a plurality of pixels arranged in a matrix, wherein each of the plurality of second blocks includes a selection circuit configured to select driving timing of the plurality of pixels belonging to each of the plurality of first blocks, and wherein each of the plurality of second blocks includes a timing generator configured to output a signal for controlling a first block scanning circuit and a second block scanning circuit.

Further features of the present invention will become apparent from the following description of exemplary embodiments with reference to the attached drawings.

BRIEF DESCRIPTION OF THE DRAWINGS

FIGS. 1A, 1B, 1C, and 1D are diagrams related to a first exemplary embodiment.

FIGS. 7A, 7B, and 7C are diagrams related to the first exemplary embodiment.

FIGS. 10A, 10B, and 10C are diagrams related to the second exemplary embodiment.

FIGS. 13A and 13B are diagrams related to a fifth exemplary embodiment.

DESCRIPTION OF THE EMBODIMENTS (Basic Configuration)

Figure 2A:
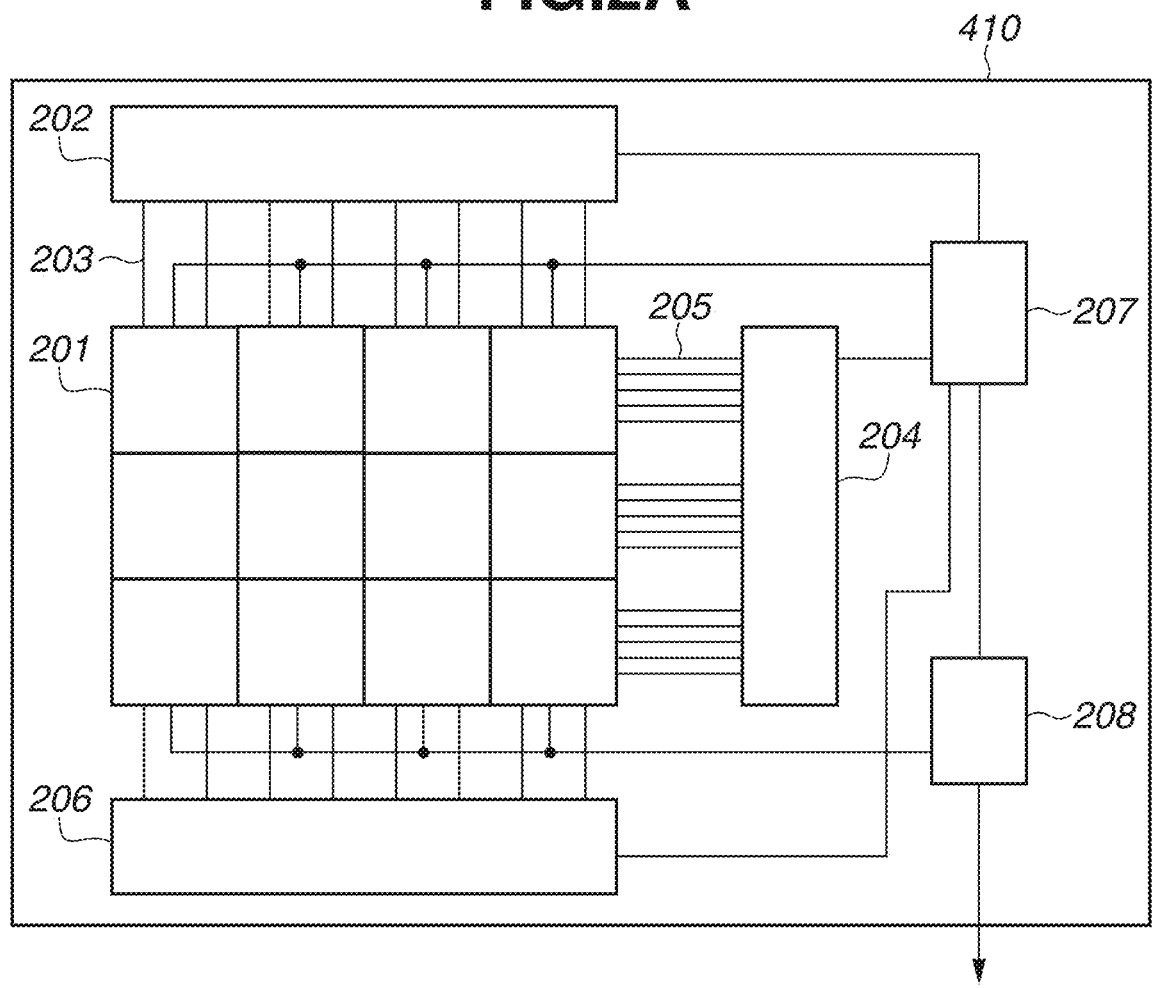
FIGS. 2A and 2B are diagrams related to the first exemplary embodiment.

FIGS. 1A to 1C are schematic diagrams illustrating an imaging device according to a first exemplary embodiment. A first chip 400 includes a plurality of pixel blocks 101 (first blocks) each including a plurality of pixels 301. In FIG. 1A, for example, each pixel block 101 includes a plurality of pixels 301 arranged in a four-row four-column matrix. For example, the first chip 400 includes a plurality of pixel blocks 101 arranged in a three-row four-column matrix.

A second chip 410 includes a plurality of blocks 201 (second blocks) each including a selection circuit. The first chip 400 and the second chip 410 are stacked to form a stacked imaging device.

The pixel blocks 101 and the blocks 201 correspond functionally on a one-to-one basis. The second blocks 201 each include at least a selection circuit. In other words, a predetermined block 201 is provided for a predetermined pixel block 101, and the selection circuit included in the predetermined block 201 selects timing of charge accumulation (driving timing) of the predetermined pixel block 101. Details of the selection circuit will be described below. The pixel blocks 101 and the blocks 201 not only correspond functionally on a one-to-one basis, but in terms of physical positional relationship as well. More specifically, in a plan view, a predetermined pixel block 101 and a predetermined block 201 that correspond to each other are provided at overlapping positions. This shortens the electrical connection paths between the pixel blocks 101 and the blocks 201 for speedup and crosstalk prevention.

FIG. 1D illustrates a configuration example of a pixel 301. The pixel 301 includes a photoelectric conversion unit PD, a transfer transistor M2, and a reset transistor M1. The transfer transistor M2 transfers a charge of the photoelectric conversion unit PD to a floating diffusion portion PD (hereinafter, FD portion). The reset transistor M1 resets the FD portion. The FD portion is connected to the gate of an amplification transistor M3. A power supply voltage VDD is supplied to the amplification transistor M3 and the reset transistor M1. A selection transistor M4 is connected to the source of the amplification transistor M3. The selection transistor M4 is connected to a vertical output line Vout. Driving signals PRES, PTX, and PSEL are input to the gates of the reset transistor M1, the transfer transistor M2, and the selection transistor M4, respectively.

A pixel signal from the photoelectric conversion unit PD is read from the pixel 301 via the vertical output line Vout. The vertical output line Vout is connected to a wiring layer of the second chip 410 via a plurality of wiring layers of the first chip 400. For example, the first chip 400 and the second chip 410 are electrically connected by physical contact between wiring portions exposed on the topmost wiring layer of the first chip 400 and wiring portions exposed on the topmost wiring layer of the second chip 410.

(Specific Configuration of Second Chip)

FIG. 2A illustrates the second chip 410 according to the present exemplary embodiment. A timing generator (TG) 207 provides a timing signal for a vertical block scanning circuit 204 (first block scanning circuit) which has the function of a vertical scanning circuit (first scanning circuit). The TG 207 also provides a timing signal for a horizontal block scanning circuit 202 (second block scanning circuit) and a horizontal scanning circuit 206 (second scanning circuit).

Signals are input to the plurality of blocks 201 from the vertical block scanning circuit 204 via a vertical block control signal line group 205. The vertical block scanning circuit 204 outputs signals for controlling the driving timing of a plurality of pixels 301 arranged in a row direction. Signals are also input to the plurality of blocks 201 from the horizontal block scanning circuit 202 via a horizontal block control signal line group 203. The horizontal block scanning circuit 202 outputs signals for controlling the driving timing of a plurality of pixels 301 arranged in a column direction. Signals are further input to the plurality of blocks 201 from the horizontal scanning circuit 206.

Figure 2B:
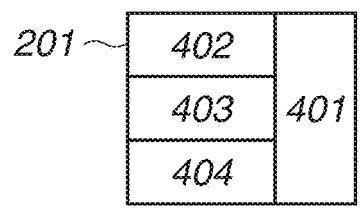

FIG. 2B illustrates a configuration of a block 201. The block 201 includes a selection circuit 401 which selects whether to give the signal of a signal line PTX[X] to a pixel 301 based on the signals from the vertical block scanning circuit 204 and the horizontal block scanning circuit 202. If the signal of the signal line PTX[X] is selected to be given to the pixel 301, a signal to be given to a signal line PTX[Y, Z] is generated. The signal given to the signal line PTX[Y, Z] is supplied to the gate of the transfer transistor M2 illustrated in FIG. 1D, whereby the charge accumulation timing of the pixel block 101 is controlled. If the signal level of the signal line PTX[Y, Z] changes from a low level to a high level, the transfer transistor M2 turns on and a charge is transferred from the photoelectric conversion unit PD to the FD portion. If the signal level of the signal line PTX[Y, Z] changes from a high level to a low level, the transfer transistor M2 turns off and the charge transfer from the photoelectric conversion unit PD to the FD portion ends. An appropriate exposure amount of each pixel block 101 can be set by the selection circuit 401. For example, if the amount of incident light varies from one pixel block 101 to another, the charge accumulation period of a pixel block 101 in which the amount of light per unit time is large can be set short. The charge accumulation period of a pixel block 101 in which the amount of light per unit time is small can be set longer than that of the pixel block 101 in which the amount of light is large. This can advantageously extend the dynamic range of the imaging device.

The block 201 includes an amplification unit 402 which is electrically connected to the signal line Vout illustrated in FIG. 1D. The amplification unit 402 is provided if the amplification transistor M3 provided in the pixel 301 is by itself not sufficient for signal amplification. The amplification unit 402 may be omitted if the amplification transistor M3 is by itself sufficient for amplification.

The block 201 also includes an AD conversion unit 403 which is electrically connected to the amplification unit 402. The AD conversion unit 403 converts an analog signal from the pixel 301 into a digital signal. For example, the AD conversion unit 403 includes a comparator, a ramp generator, and a counter. A ramp signal (comparison signal) from the ramp generator is input to one input node of the comparator. The signal line Vout is connected to the other input node of the comparator. The comparator compares the ramp signal (comparison signal) and the signal of the signal line Vout. The counter measures time until the output of the comparator is changed or inverted, whereby a digital signal value is obtained. Instead of the AD conversion unit of ramp type, an AD conversion unit of sequential comparison type using binary weight capacitors may be employed. Since the AD conversion unit 403 has the function of converting an analog signal into a digital signal, the AD conversion unit 403 may be referred to as a signal processing unit.

The block 201 further includes a memory 404 which stores the digital signal from the AD conversion unit 403. The digital signal stored in the memory 404 is controlled by the horizontal scanning circuit 206 and output to a signal processing unit 208. The block 201 also includes a sense circuit (not illustrated) which amplifies the digital signal stored in the memory 404.

The digital signal output from the memory 404 is processed by the signal processing unit 208. The signal processing unit 208 performs, for example, a difference calculation between a signal of an optical black region and a signal of an effective pixel region, and addition of pixel signals. Based on the processing result, the signal processing unit 208 outputs a control signal to the TG 207. For example, as will be described below, the signal processing unit 208 outputs a signal for controlling charge accumulation time (exposure time) of each pixel block 101.

In the present exemplary embodiment, each of the selection circuits 401 corresponding to a different one of the pixel blocks 101 is provided in a different one of the blocks 201 corresponding to the respective pixel blocks 101. The pixel blocks 101 and the selection circuits 401 correspond functionally in the sense that the signals given to the gates of the transfer transistors M2 are selected by the selection circuits 401 and thereby the charge accumulation time of the plurality of pixels arranged in the pixel blocks 101 is controlled. Since the pixel blocks 101 and the blocks 201 also correspond in terms of physical positional relationship as described above, the selection circuits 401 provided in the blocks 201 and the pixel blocks 101 also correspond in terms of physical positional relationship. For example, the first pixel blocks 101 and the selection circuits 401 overlap in a plan view.

The blocks 201 corresponding to the respective pixel blocks 101 each include circuits that can be provided on the first chip 400 or the second chip 410 other than the selection circuit 401. Examples of the circuits other than the selection circuit 401 include the amplification unit 402, the AD conversion unit 403, and the memory 404. Arranging the circuits other than the selection circuit 401 in the block 201 can reduce the space of the first chip 400 other than the pixel blocks 101 for space saving. The number of pixel blocks 101 provided on the first chip 400 can thus be increased.

Japanese Patent Application Laid-Open No. 2012-151847 discusses an "AD conversion unit 24" which is arranged on the first chip. By contrast, according to the present exemplary embodiment, the AD conversion units 403 corresponding to the "AD conversion unit 24" discussed in Japanese Patent Application Laid-Open No. 2012-151847 are provided in the blocks 201 of the second chip 410. More pixels 301 can thus be arranged on the first chip 400. Since the AD conversion units 403 are provided in the respective blocks 201, AD conversion can be performed by parallel processing for speedup. Japanese Patent Application Laid-Open No. 2012-151847 discusses a "row selection block 22" which is also arranged on the first chip. By contrast, according to the present exemplary embodiment, the vertical block scanning circuit 204 corresponding to the "row selection block 22" discussed in Japanese Patent Application Laid-Open No. 2012-151847 is provided on the second chip 410. Even more pixels can thus be arranged on the first chip 400. The provision of a plurality of functional blocks on the second chip 410 may narrow the space for the blocks 201 on the second chip 410. In such a case, a plurality of second chips 410 can be used.

(Exposure Time Varying from One Pixel Block to Another and Selection Circuits)

Figure 3A:
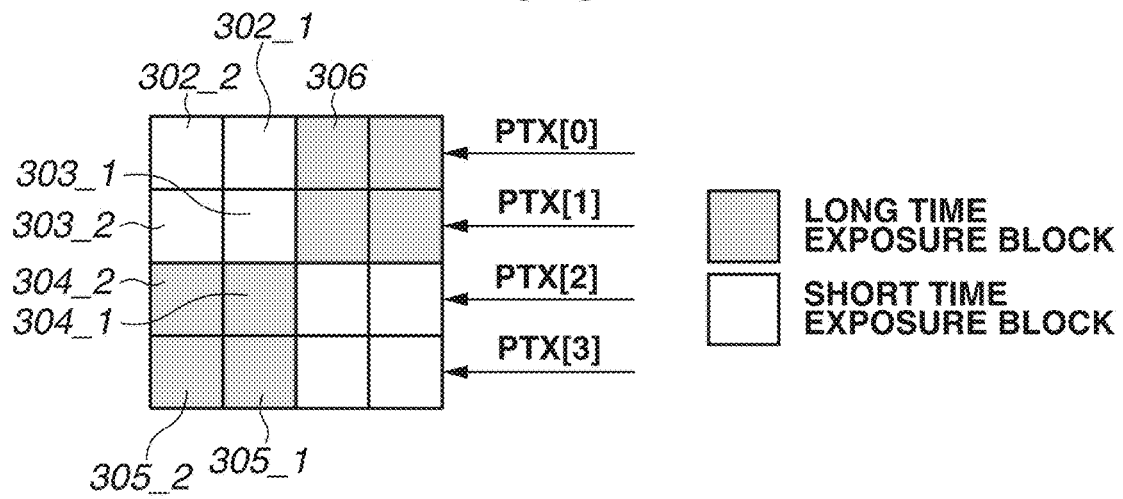
FIGS. 3A and 3B are diagrams related to the first exemplary embodiment.

FIG. 3A illustrates a plurality of pixel blocks 101 which is arranged in two rows and two columns. Each pixel block 101 includes two rows and two columns of pixels. The pixel blocks 101 illustrated in not shaded blocks are ones that perform short time exposure. The pixel blocks 101 illustrated in shaded blocks are ones that perform long time exposure.

In an imaging region, a first pixel block and a second pixel block arranged at a position different from the first block may differ in the level (signal value) of a pixel signal. For example, if the signal value of a pixel in the first pixel block falls below noise level, sufficient gradation may be unable to be obtained in a dark portion. If, in such a case, the exposure time of the first and second pixel blocks is uniformly set to be long, high signal values of a pixel in the second pixel block may reach a saturation level. As a result, the second pixel block can fail to provide sufficient gradations. Therefore, as illustrated in FIG. 3A, in the present exemplary embodiment, a plurality of blocks that perform long time exposure and a plurality of blocks that perform short time exposure are provided, to achieve a wide dynamic range.

Row selection pulse signals PTX[X] are given to the selection circuits 401 from the vertical block scanning circuit 204 of FIG. 2A via the vertical block control signal line group 205. The signals of the signal lines PTX[X] are selected by the selection circuits 401, and pixel selection pulse signals (pixel block selection pulse signals) PTX[Y, Z] are given to the gates of the transfer transistors M2 according to the timing of selection. The pixel selection pulse signals PTX[Y, Z] may be referred to as pixel driving signals (pixel block driving signals).

As illustrated in FIG. 3A, the signal lines PTX[0] to PTX[3] correspond to the pixels in the first to fourth rows. FIG. 3A illustrates two rows and two columns, i.e., a total of four blocks, each including two rows and two columns, i.e., four pixels. The signal lines PTX[0] and PTX[1] correspond to two pixel blocks, and the signal lines PTX[2] and PTX[3] correspond to the other two pixel blocks. In FIG. 3A, pixels 302_1 and 302_2 are intended for short time exposure. A pixel 306 is intended for long time exposure. If the operation of the transfer transistors M2 of the pixels 302_1, 302_2, and 306 is controlled by using only the signal line PTX [0], only either one of the short and long time exposures can be performed. Then, in the present exemplary embodiment, the exposure time of each pixel is controlled by generating the pixel selection pulse signals PTX[Y, Z] from the row selection pulse signals PTX[X] by using the horizontal block control signal line group 203, the vertical block control signal line group 205, and the selection circuits 401.

Figure 3B:
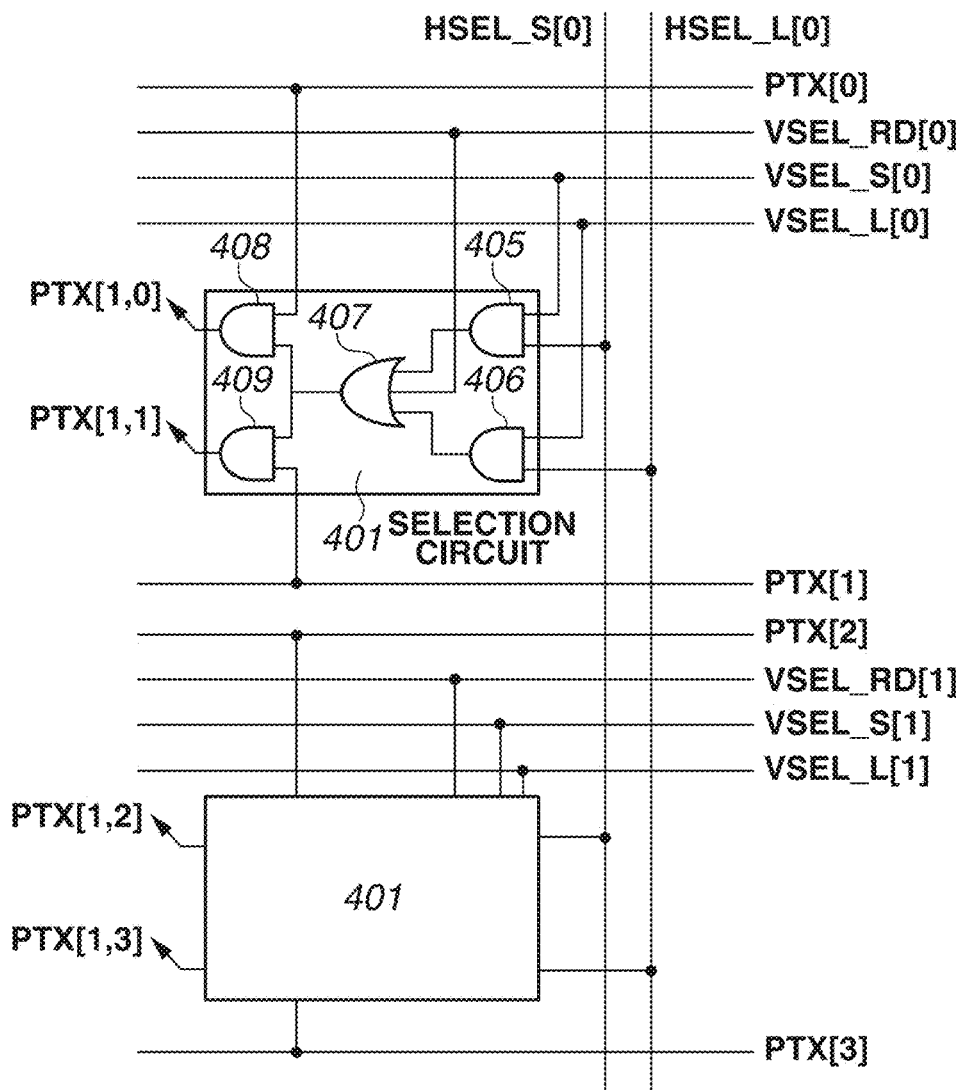

FIG. 3B illustrates a configuration example of the signal line groups for transmitting the control signals and the selection circuits 401. Signal lines VSEL transmit vertical block control signals. Signal lines HSEL transmit horizontal block control signals. Signal lines VSEL_S are intended for short time exposure. Signal lines VSEL_L are intended for long time exposure. A signal line HSEL_S is intended for short time exposure. A signal line HSEL_L is intended for long time exposure. Signal lines VSEL_RD are intended for reading.

Each selection circuit 401 generates the pixel selection pulse signals PTX[Y, Z] from the row selection pulse signals PTX[X] if both the signal levels given to the signal lines HSEL_S and VSEL_S are high or if both the signal levels given to the signal lines HSEL_L and VSEL_L are high. The generated pixel selection pulse signals PTX[Y, Z] are input to the gates of the transfer transistors M2. For the other combinations, the pixel selection pulse signals PTX[Y, Z] are not generated from the row selection pulse signals PTX[X], and no signal is input to the gates of the transfer transistors M2.

Specifically, the vertical block control signal VSEL_S and the horizontal block control signal HSEL_S are input to an AND circuit 405. The AND circuit 405 is configured to output a signal if both the block control signals VSEL_S and HSEL_S have a high level. The vertical block control signal VSEL_L and the horizontal block control signal HSEL_L are input to an AND circuit 406. The AND circuit 406 is configured to output a signal if both the block control signals VSEL_L and HSEL_L are a high level. The vertical block control signal VSEL_RD and the outputs of the AND circuits 405 and 406 are input to an OR circuit 407. The OR circuit 407 is configured to output a signal if any of the signals is input. The row selection pulse signals PTX[X] and the output of the OR circuit 407 are input to AND circuits 408 and 409. The AND circuits 408 and 409 generate the pixel selection pulse signals PTX[Y, Z] if the respective row selection pulse signals PTX[X] and the output signal of the OR circuit 407 are both input.

The signal line PTX[1, 0] in FIG. 3B transmits a signal input to the gates of the transfer transistors M2 of the pixels 302_1 and 302_2. Similarly, the signal line PTX[1, 1] corresponds to pixels 303_1 and 303_2. The signal line PTX[1, 2] corresponds to pixels 304_1 and 304_2. The signal line PTX[1, 3] corresponds to pixels 305_1 and 305_2.

(Timing Chart)

Figure 4:
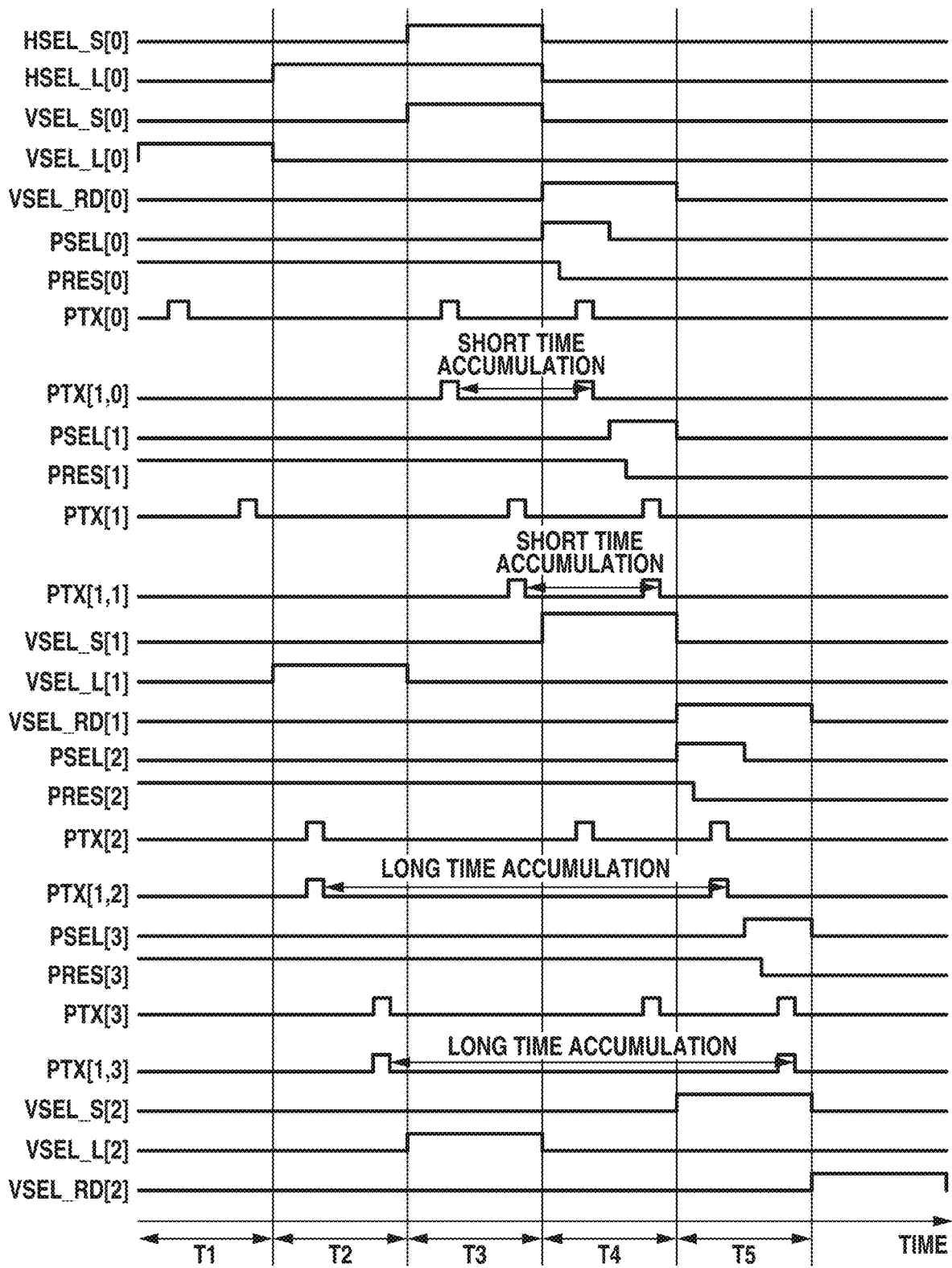
FIG. 4 is a diagram related to the first exemplary embodiment.

FIG. 4 illustrates a timing chart related to the pixels 302_1 to 305_2.

(Period T1)

Period T1 is a period in which the pixel block 101 at the first row and first column starts charge accumulation for long time exposure and does not start charge accumulation for short time exposure. In the present exemplary embodiment, the pixel block 101 including the pixels 302_1, 302_2, 303_1, and 303_2 is not a long time exposure one, and does not start charge accumulation in period T1. In other words, the selection circuit 401 needs to be configured to not generate a signal on the signal line PTX[1, 0] or PTX[1, 1] even if a signal is input to the signal line PTX[0]. The signal line VSEL_L[0] is connected to a plurality of pixels arranged in the first row in common. The first row includes the pixel 306 which performs long time exposure. The signal level of the signal line VSEL_L[0] therefore needs to be maintained at a high level. If the horizontal block control signal HSEL_L[0] here were a high level, the pixel selection pulse signal PTX[1, 0] would be generated from the row selection pulse signal PTX[0] since the signal level of the signal line VSEL_L[0] is high. The signal then would be input to the gates of the transfer transistors M2 of the pixels 302_1 and 302_2. For such a reason, the signal level of the signal line HSEL_L[0] is set at a low level. In FIG. 4, the signal levels of the signal lines HSEL_S [0] and VSEL_S [1] are set at a low level.

By virtue of such driving, the pixel selection pulse signal PTX[1, 0] is not generated from the row selection pulse signal PTX[0], and the pixel selection pulse signal PTX[1, 1] is not generated from the row selection pulse signal PTX[1]. No signal is thus input to the gates of the transfer transistors M2 of the pixels 302_1, 302_2, 303_1, and 303_2.

(Period T2)

Period T2 is a period in which the pixel block 101 at the second row and first column starts charge accumulation if the pixel block 101 is one for long time exposure, and does not start charge accumulation if the pixel block 101 is one for short time exposure. In the present exemplary embodiment, the pixels 304_1, 304_2, 305_1, and 305_2 belong to a pixel block 101 for long time exposure. Charge accumulation is therefore started in period T2. The vertical block control signal VSEL_L[1] and the horizontal block control signal HSEL_L[0] are then set at a high level. As a result, the pixel selection pulse signal PTX[1, 2] is generated from the row selection pulse signal PTX[2]. The pixel selection pulse signal PTX[1, 2] is given to the gates of the transfer transistors M2 of the pixels 304_1 and 304_2. Similarly, the pixel selection pulse signal PTX[1, 3] is generated from the row selection pulse signal PTX[3]. The pixel selection pulse signal PTX[1, 3] is given to the gates of the transfer transistors M2 of the pixels 305_1 and 305_2. Long time accumulation is thus started for the pixels of the second-row pixel block 101.

(Period T3)

Period T3 is a period in which the pixel block 101 at the first row and first column starts charge accumulation for short time exposure. Specifically, charge accumulation for short time exposure on the pixels 302_1, 302_2, 303_1, and 303_2 is started in period T3. In such a case, the signal levels of both the vertical block control signal VSEL_S[0] and the horizontal block control signal HSEL_S[0] are set at a high level. As a result, the pixel selection pulse signal PTX[1, 0] is generated from the row selection pulse signal PTX[0]. The pixel selection pulse signal PTX[1, 0] is given to the gates of the transfer transistors M2 of the pixels 302_1 and 302_2. Similarly, the pixel selection pulse signal PTX[1, 1] is generated from the row selection pulse signal PTX[1]. The pixel selection pulse signal PTX[1, 1] is given to the gates of the transfer transistors M2 of the pixels 303_1 and 303_2. Short time accumulation is thereby started.

(Period T4)

Period T4 is a period in which the pixels 302_1, 302_2, 303_1, and 303_2 belonging to the pixel block 101 at the first row and first column end the charge accumulation for short time exposure. The pixel selection pulse signals PTX [Y, Z] need to be given to the gates of the transfer transistors M2 of such pixels. For that purpose, the signal level of the signal line VSEL_RD[0] is set at a high level. The signal line VSEL_RD[X] is intended for reading. If the signal level of this signal line is set at a high level, the pixel selection pulse signals PTX[Y, Z] are generated from the row selection pulse signals PTX[X] regardless of what level the vertical block control signals VSEL and the horizontal block control signals HSEL are at. The pixel selection pulse signals PTX[Y, Z] are thereby given to the gates of the transfer transistors M2 of the pixels.

On the other hand, the pixels 304_1, 304_2, 305_1, and 305_2 belonging to the pixel block 101 at the second row and first column continue long time exposure in period T4. For that purpose, no pixel selection pulse signal PTX[Y, Z] is given to the gates of the transfer transistors M2 of the pixels 304_1, 304_2, 305_1, and 305_2 in period T4. Here, the signal level of the vertical block control signal VSEL_L [1] is maintained at a low level, so that no pixel selection pulse signal PTX[Y, Z] is generated from the row selection pulse signal PTX[2] or PTX[3]. The pixel driving signals to be given to the gates of the transfer transistors M2 are thereby prevented from being given to the pixels 304_1, 304_2, 305_1, and 305_2.

(Period T5)

Period T5 is a period in which the pixels 304_1, 304_2, 305_1, and 305_2 belonging to the pixel block 101 at the second row and first column end the charge accumulation for long time exposure. The pixel selection pulse signals PTX [Y, Z] need to be given to the gates of the transfer transistors M2 of such pixels. For that pulse, the signal level of the signal line VSEL_RD[1] is set at a high level. The pixel selection pulse signals PTX[Y, Z] are thereby generated from the row selection pulse signals PTX[2] and PTX[3]. The pixel selection pulse signals PTX[Y, Z] are given to the gates of the transfer transistors M2 of the pixels 304_1, 304_2, 305_1, and 305_2.

Although not described in detail above, signal lines PSEL illustrated in FIG. 4 transmit signals for turning on the selection transistors M4. Signal lines PRES transmit signals for turning on the reset transistors M1. The signal lines PSEL and the signal lines PRES are included in the vertical block control signal line group 205.

As described above, each pixel block 101 can be independently selected and controlled in exposure time by configuring the selection circuits 401, the vertical block scanning circuit 204, the vertical block control signal line group 205, the horizontal block scanning circuit 202, and the horizontal block control signal line group 203.

The selection of the pixel driving signals by using the horizontal block control signal line group 203 and the vertical block control signal line group 205 described above is just an example. The selection circuits 401 according to the present exemplary embodiment may be any circuit that is configured so that the input timing of pixel driving signals related to a plurality of pixel blocks 101 can be independently selected. For example, in the foregoing example, the selection circuits 401 select whether to generate pixel transfer pulse signals (pixel selection pulse signals) from row transfer pulse signals (row selection pulse signals), based on signals given in a first direction and signals given in a second direction different from the first direction. As employed herein, the signals given in the first direction refer to the signals from the vertical block scanning circuit 204. The signals given in the second direction refer to the signals from the horizontal block scanning circuit 202. However, circuits other than such selection circuits 401 may be used to control the exposure time with respect to each pixel block 101.

For example, the exposure time may be controlled block by block by using a circuit discussed in Japanese Patent Application Laid-Open No. 2012-151847.

In the foregoing example, the exposure time is controlled by controlling the signals input to the gates of the transfer transistors M2. However, the signals controlled by the selection circuits 401 are not limited thereto. For example, an overflow transistor may be provided between the photoelectric conversion unit PD and the power supply voltage VDD, and the exposure time may be controlled by controlling a signal input to the gate of the overflow transistor. In such a case, the signals to be controlled by the selection circuits 401 refer to the signals input to the gates of the overflow transistors.

In the foregoing example, the first pixel block and the second pixel block arranged in the same row are described to have different charge accumulation times. However, the first pixel block and the second pixel block may have the same charge accumulation time, and may be driven to have different start times and end times of exposure. In other words, such driving can be performed if the input timing of the pixel driving signals related to the plurality of pixel blocks 101 is independently selectable.

In the foregoing example, the vertical block scanning circuit 204 is described to have the function of a vertical scanning circuit. However, the vertical block scanning circuit 204 and the vertical scanning circuit may be separately provided.

(Determination of Exposure Time Pixel Block by Pixel Block by Preliminary Exposure)

Figure 5A:
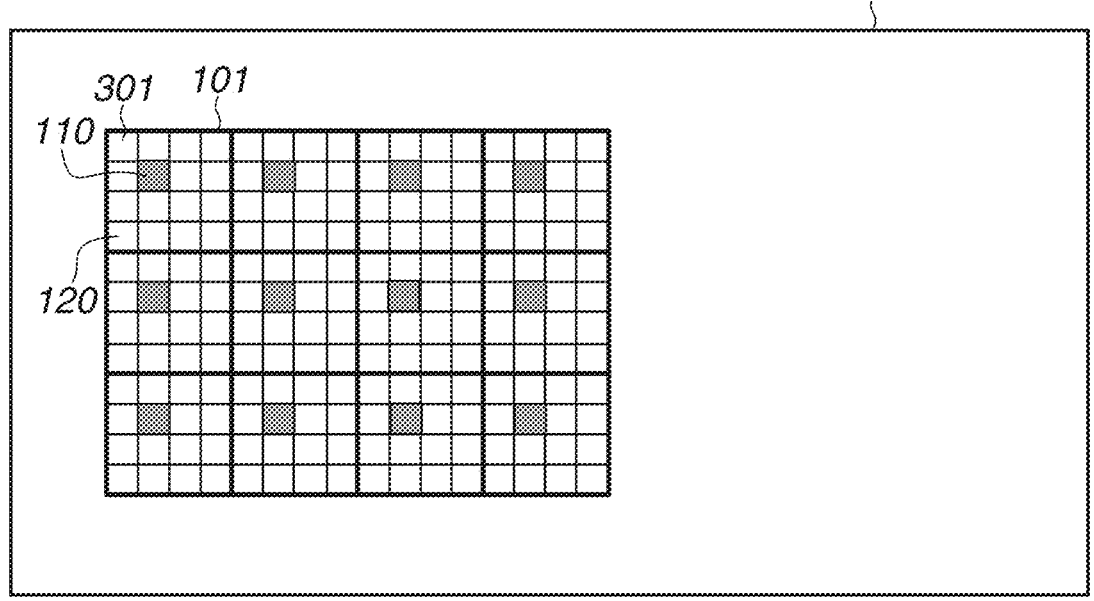
FIGS. 5A and 5B are diagrams related to the first exemplary embodiment.

FIG. 5A illustrates the pixel blocks 101 which include pixels 110 of a first type and pixels 120 of a second type. The pixels 110 of the first type are some of the pixels arranged in the pixel blocks 101, and are used for thinning-out reading (thinned pixels). The pixels 120 of the second type are pixels not used for thinning-out reading but for image formation (not-thinned pixels).

Figure 5B:
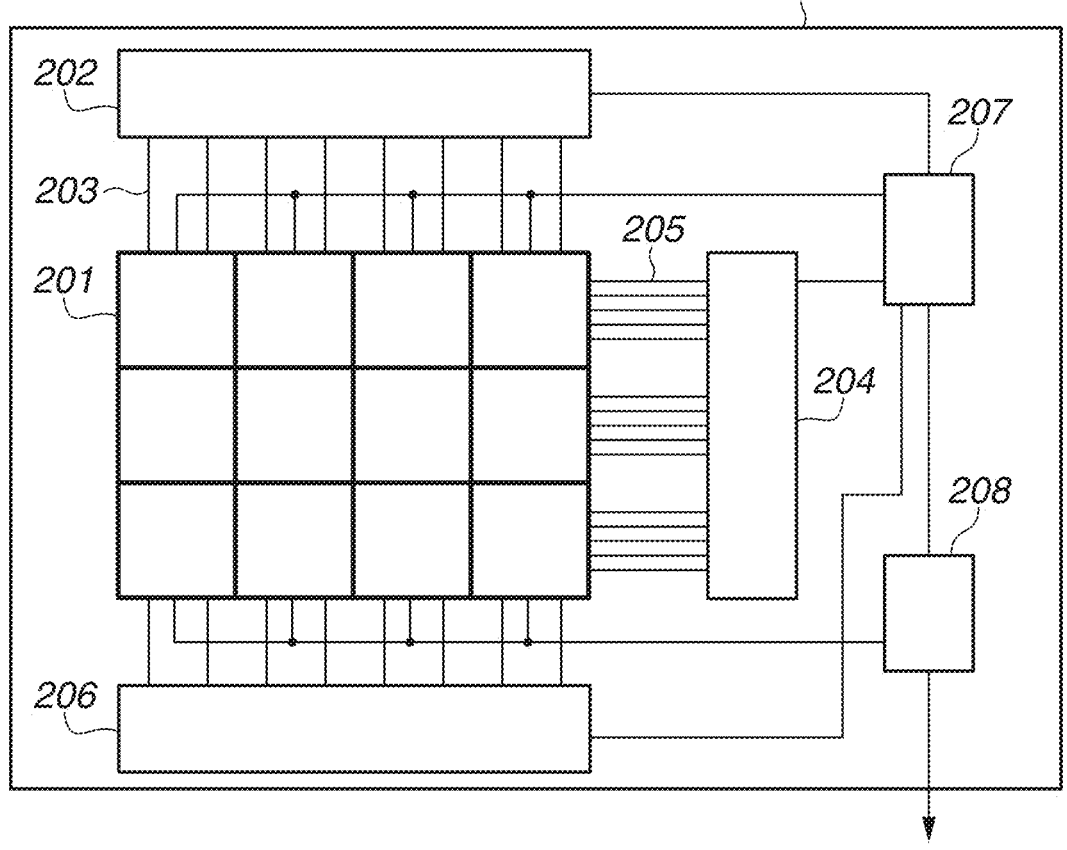

Initially, thinning-out reading is performed on the pixels 110 of the first type, and an exposure condition of each pixel block 101 is determined. Specifically, the signals of the pixels 110 of the first type arranged in the plurality of pixel blocks 101 are read via the vertical output lines Vout. The analog signals of the pixels 110 are input to the amplification units 402 of the second chip 410 illustrated in FIG. 5B via a plurality of wiring layers. The analog signals amplified by the amplification units 402 of the second chip 410 are converted into digital signals by the AD conversion units 403. The signals from the pixels 110 of the first type, stored in the memories 404 are sequentially read and output to the signal processing unit 208 by using the TG 207 and the horizontal scanning circuit 206.

The signal processing unit 208 determines the exposure condition of each pixel block 101. For example, the signal processing unit 208 compares the value of the pixel signal with a threshold. If the value of the pixel signal is greater than the threshold, the signal processing unit 208 determines to perform short time exposure on the pixel block 101 to which the pixel 110 of the first type belongs. If the value of the pixel signal is less than or equal to the threshold, the signal processing unit 208 determines to perform long time exposure on the pixel block 101 to which the pixel 110 of the first type belongs. The signal processing unit 208 may determine whether to perform short time exposure or long time exposure based on a table in which the values of the pixel signal are associated with exposure time modes.

The TG 207, the vertical block scanning circuit 204, the horizontal block scanning circuit 202, and the selection circuits 401 are controlled based on the processing result of the signal processing unit 208. For example, as illustrated in FIG. 3A, different exposure times can thereby be set for the respective pixel blocks 101.

As described above, the exposure time of each pixel block 101 can be controlled after the thinning-out reading on the predetermined pixels arranged in the pixel blocks 101. In the present exemplary embodiment, compared to the case where signals are read from all the pixels 301 before the determination of the exposure time of each pixel block 101, optimum exposure conditions can therefore be determined in a shorter time since the exposure times are controlled based on the pixels read by thinning-out reading.

Motion information about an object in each pixel block 101 can be extracted from differences between frames. For example, according to the motion of the object, a pixel block 101 in which short time exposure is performed in the previous frame may be subjected to long time exposure, or conversely, a pixel block 101 in which long time exposure is performed in the previous frame may be subjected to short time exposure. The extraction of the motion information can be performed by the signal processing unit 208.

(Modification 1)

Figure 6A:
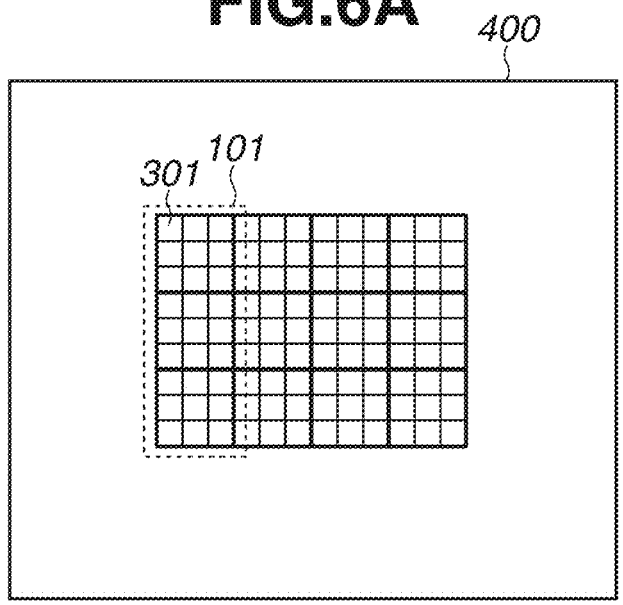
FIGS. 6A, 6B, 6C, and 6D are diagrams related to the first exemplary embodiment.

FIG. 6A is a diagram corresponding to FIG. 1A. A difference lies in that each pixel block 101 includes three rows and three columns of pixels 301, and a plurality of pixel blocks 101 is arranged in three rows and four columns. FIG. 6B is a diagram corresponding to FIG. 1B.

Figure 6C:
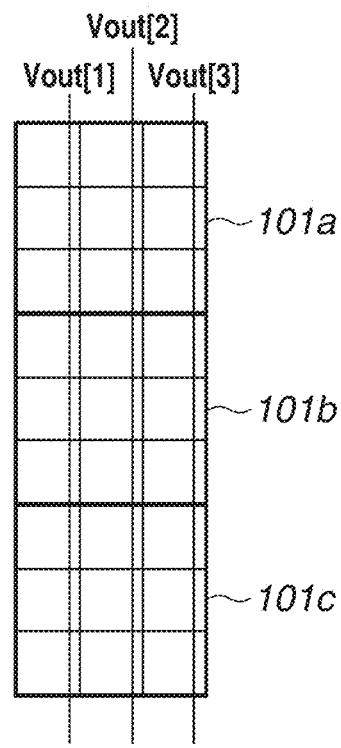
Figure 6B:
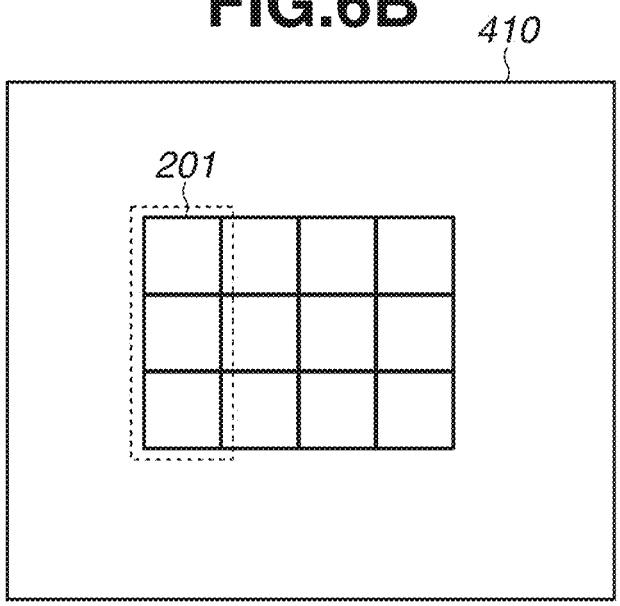

FIG. 6C is an enlarged view of the pixel blocks 101 in the first column, surrounded by the broken lines in FIG. 6A. FIG. 6C illustrates pixel blocks 101a to 101c of the first to third rows. Among the plurality of pixels 301 constituting the pixel blocks 101a to 101c, a plurality of pixels 301 arranged in the first to third columns is connected to a first vertical output line Vout[1] to a third vertical output line Vout[3], respectively.

Figure 6D:
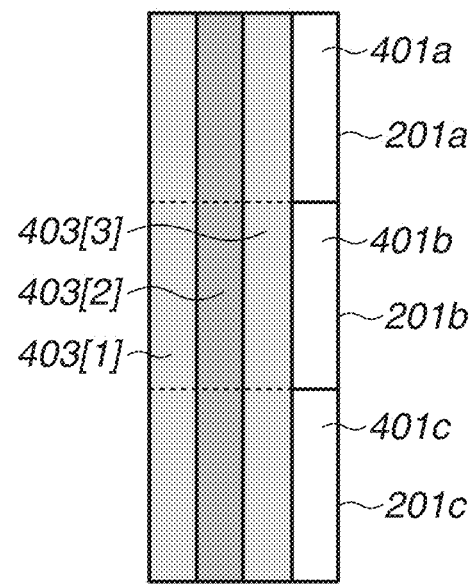

FIG. 6D is an enlarge view of the blocks 201 in the first column, surrounded by the broken lines in FIG. 6B. FIG. 6D illustrates blocks 201a to 201c of the first to third rows. Selection circuits 401a to 401c are provided to correspond to the blocks 201a to 201c. AD conversion units 403 are provided for the respective columns of pixels. The first to third vertical output lines Vout[1] to Vout[3] are connected to the first to third AD conversion units 403[1] to 403[3]. For example, an analog signal from the first vertical output line Vout[1] is converted into a digital signal by the first AD conversion unit 403[1]. In such a manner, a plurality of blocks 201 may share a circuit having one function. Such a configuration can increase the areas occupied by the respective AD conversion units 403, and can increase the degree of freedom in layout.

(Modification 2)

As illustrated in FIG. 6C, if the plurality of pixels 301 is arranged on the first chip 400 at equal pitches in the column direction, the plurality of vertical output lines Vout is also arranged at equal pitches. However, in the case of the layout illustrated in FIG. 6D, if the wiring from the plurality of vertical output lines Vout is extended to the second chip 410, the distances between the vertical output lines Vout and the AD conversion units 403 vary column by column. For example, the wiring path length from the third vertical output line Vout[3] to the third AD conversion unit 403[3] is greater than that from the first vertical output line Vout[1] to the first AD conversion unit 403[1], with a difference in wiring capacitance. This may increase the complexity of routing of the wiring and make the wiring layout complicated.

FIG. 7A illustrates a configuration example for solving such a problem. In FIG. 7A, the selection circuits 401a to 401c are provided to correspond to the blocks 201a to 201c. A difference from FIG. 6D lies in that the selection circuits 401a to 401c are provided not in side portions but in lower portions of the blocks 201a to 201c. The first to third AD conversion units 403[1] to 403[3] are provided to correspond to each of the pixel blocks 101a to 101c. With such a configuration, the pitch of the first to third AD conversion units 403[1] to 403[3] in the column direction is substantially the same as that of the first to third vertical output lines Vout[1] to Vout[3] in the column direction. Since the distances between the vertical output lines Vout and the AD conversion units 403 in the respective columns become substantially the same, variations in the wiring capacitance can be reduced.

(Modification 3)

FIG. 7B illustrates a further modification of the configuration of FIG. 7A. FIG. 7B is the same as FIG. 7A in that the pitch of the first to third AD conversion units 403[1] to 403[3] in the column direction and the pitch of the first to third vertical output lines Vout[1] to Vout[3] in the column direction are substantially the same. However, in FIG. 7B, a plurality of blocks 201 shares AD conversion units 403[1] to 403[3]. Specifically, the blocks 201a and 201b share the first to third AD conversion units 403[1] to 403[3]. According to the configuration of FIG. 7B, the areas occupied by the respective AD conversion units 403 can be increased and AD conversion units of large circuit scale can be employed, compared to that of FIG. 7A.

(Modification 4)

In FIG. 7C, the selection circuits 401a to 401c are provided to correspond to the blocks 201a to 201c. The first to third vertical output lines Vout[1] to Vout[3] are connected to the first to third AD conversion units 403[1] to 403[3]. The first to third AD conversion units 403[1] to 403[3] are provided to correspond to the blocks 201a to 201c. According to the configuration of FIG. 7C, the areas occupied by the respective AD conversion units 403 can be increased and AD conversion units of large circuit scale can be employed, compared to that of FIG. 7A. While the configuration of FIG. 7B is limited to the AD conversion units 403[1] to 403[3] of long and narrow layout, the configuration of FIG. 7C is free from such a limitation and can secure a degree of freedom in layout.

(Modification 5)

Figure 8A:
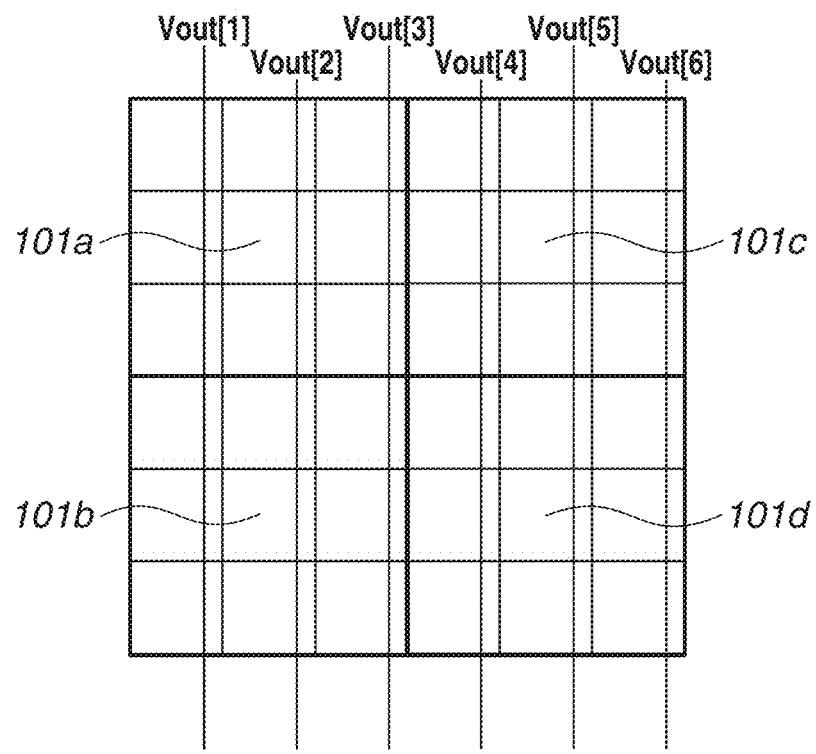
FIGS. 8A and 8B are diagrams related to the first exemplary embodiment.
Figure 8B:
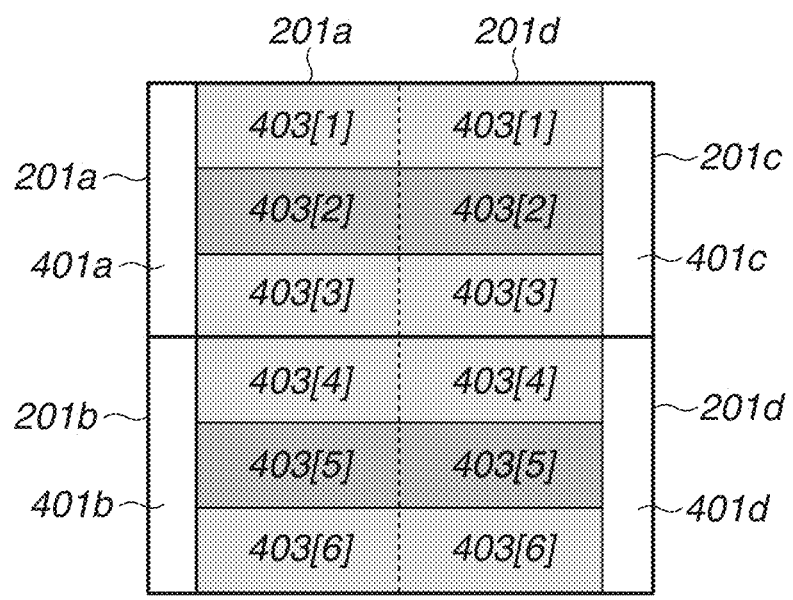

FIG. 8A is a diagram illustrating a first chip on which four pixel blocks 101a to 101d are arranged, each pixel block including a plurality of pixels in three rows and three columns. First to sixth vertical output lines Vout[1] to Vout[6] are provided to correspond to the first to sixth columns of pixels. As illustrated in FIG. 8B, a second chip includes blocks 201a to 201d which are provided to correspond to the pixel blocks 101a to 101d. Selection circuits 401a to 401d corresponding to the pixel blocks 101a to 101d are provided in the blocks 201a to 201d. The first to sixth vertical output lines Vout[1] to Vout[6] are connected to first to sixth AD conversion units 403[1] to 403[6]. The first to third AD conversion units 403[1] to 403[3] are shared by the blocks 201a and 201c. The fourth to sixth AD conversion units 403[4] to 403[6] are shared by the blocks 201b and 201d. This can increase the areas occupied by the respective AD conversion units 403, and AD conversion units of large circuit scale can be employed. The first to third vertical output lines Vout[1] to Vout[3] provided on the first chip and the first to third AD conversion units 403[1] to 403[3] provided on the second chip can be wired and connected over the block 201a. Similarly, the fourth to sixth vertical output lines Vout[4] to Vout[6] provided on the first chip and the fourth to sixth AD conversion units 403[4] to 403[6] provided on the second chip can be wired and connected over the block 201d. As employed herein, being wired and connected over the block 201a or 201d means, for example, that the junctions between the first chip and the second chip overlap with the block 201a or 201d in a plan view. By employing such a configuration, the wiring extended from the vertical output lines Vout[1] to Vout[6] to the AD conversion units 403[1] to 403[6] can be shortened and variations in the wiring capacitances of the respective wires can be reduced. The simplified routing of the wiring from the vertical output lines Vout[1] to Vout[6] to the AD conversion units 403[1] to 403[6] can secure a degree of freedom in wiring layout about other wiring.

A second exemplary embodiment is different from the first exemplary embodiment in that a first chip 400 includes amplification units and AD conversion units, and blocks provided on a second chip 410 include TGs and signal processing units.

Figure 9:
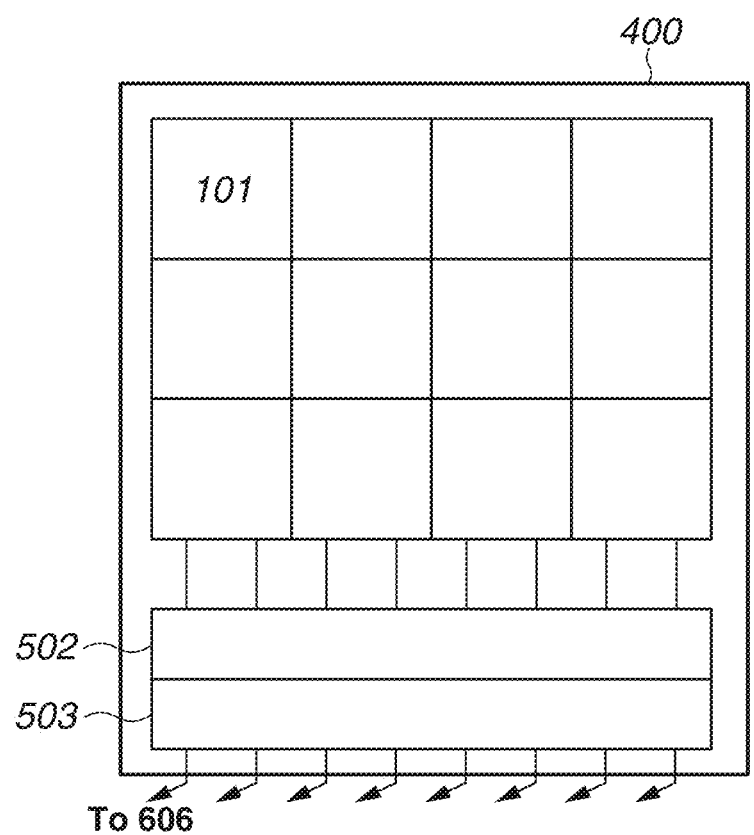
FIG. 9 is a diagram related to a second exemplary embodiment.

FIG. 9 illustrates the first chip 400 according to the present exemplary embodiment. A plurality of pixel blocks 101 is arranged in a matrix. The first chip 400 includes a column circuit including an amplification unit 502 and an AD conversion unit 503 with respect to each column of the plurality of pixel blocks 101. The amplification units 502 are provided for supplementary purposes, and may be omitted in some configurations.

FIG. 9 illustrates a configuration in which all the AD conversion units 503 are provided on the first chip 400. However, first portions of elements constituting the AD conversion units 503 may be provided on the first chip 400 and second portions on the second chip 410. For example, comparators of the AD conversion units 503 may be provided on the first chip 400 and counters on the second chip 410. The provision of the counters on the second chip 410 secures space on the first chip 400, which is advantageous in arranging more pixels.

FIG. 10A illustrates the second chip 410 according to the present exemplary embodiment. Signals from a horizontal block scanning circuit 602 are input to a plurality of second blocks 601 via a horizontal block control signal line group 603. Signals from a vertical block scanning circuit 604 are input to the plurality of second blocks 601 via a vertical block control signal line group 605.

FIG. 10B illustrates a configuration of each second block 601. The second block 601 includes a TG 207 and a signal processing unit 208 aside from a selection circuit 401.

Return to FIG. 9. Digital signals from the AD conversion units 503 are stored in a memory 606 illustrated in FIG. 10A. Signals from the memory 606 are output to the signal processing units 208 of FIG. 10B. For example, the signal processing units 208 perform a difference calculation between a signal of an optical black region and a signal of an effective pixel region, and addition of pixel signals. Based on the processing result, the signal processing units 208 output control signals to the TGs 207. For example, the signal processing units 208 output signals for controlling charge accumulation time (exposure time) of the respective pixel blocks 101. The TGs 207 control the exposure time of the respective pixel blocks 101 by outputting signals to the horizontal block scanning circuit 602 and the vertical block scanning circuit 604 and controlling driving signals PTX via the selection circuits 401. For example, a first pixel block can be controlled to have a first exposure time, and a second pixel block can be controlled to have a second exposure time which is an exposure time longer than the first exposure time.

FIG. 10C illustrates a modification of the configuration of the second block 601. In FIG. 10C, selection circuits 401*a* to 401*c* are provided to correspond to blocks 601*a* to 601*c*. Meanwhile, the TG 207 is shared by the blocks 601*a* and 601*b*. The signal processing unit 208 is shared by the blocks 601*b* and 601*c*.

In the present exemplary embodiment, the selection circuits 401 corresponding to the pixel blocks 101 are provided in the blocks 201 corresponding to the respective pixel blocks 101. The blocks 201 corresponding to the pixel blocks 101 also include circuits that can be provided on the first chip 400 or the second chip 410 other than the selection circuits 401. Examples of the circuits other than the selection circuits 401 include the TGs 207 and the signal processing units 208. By arranging the circuits other than the selection circuits 401 in the blocks 201, the space of the first chip 400 other than the pixel blocks 101 and the space of the second chip 410 other than the blocks 201 can advantageously be reduced for space saving.

A third exemplary embodiment is different from the second exemplary embodiment in that the amplification units and the AD conversion units which are provided on the first chip 400 in the second exemplary embodiment are arranged in second blocks 901 on the second chip 410.

Figure 11A:
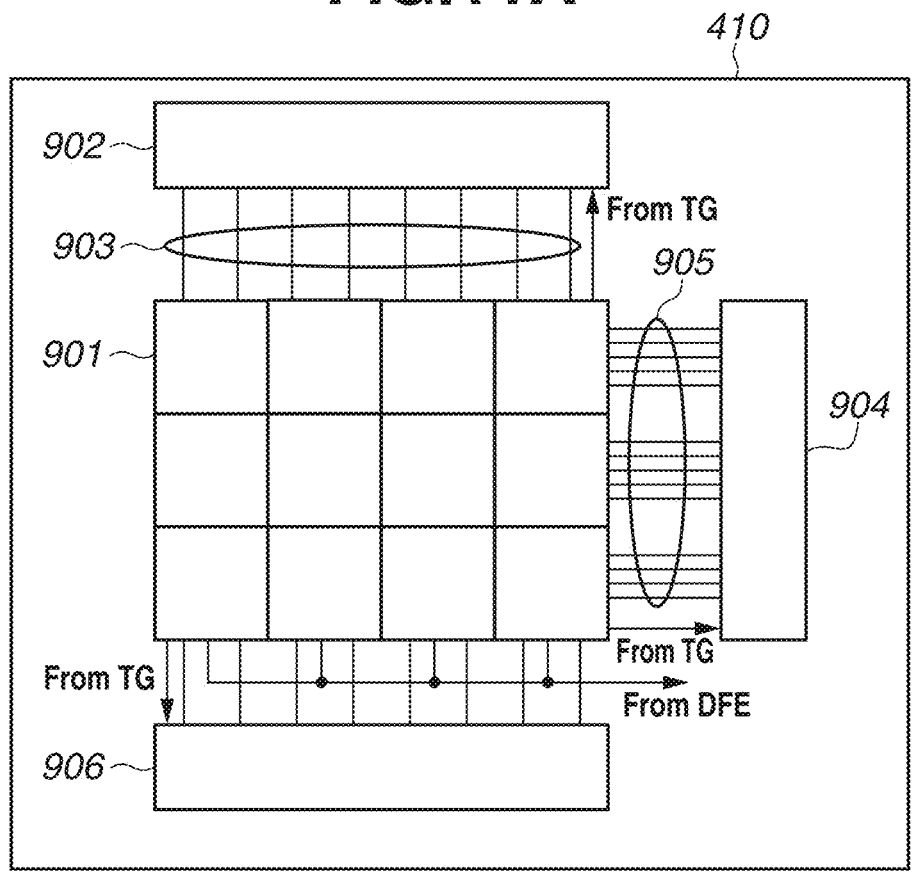
FIGS. 11A and 11B are diagrams related to a third exemplary embodiment.

FIG. 11A illustrates the second chip 410 according to the present exemplary embodiment. Signals from a horizontal block scanning circuit 902 are input to a plurality of second blocks 901 via a horizontal block control signal line group 903. Signals from a vertical block scanning circuit 904 are input to the plurality of second blocks 901 via a vertical block control signal line group 905.

Figure 11B:
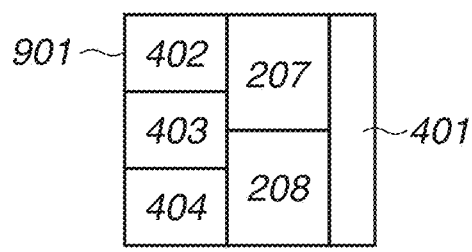

FIG. 11B illustrates a configuration of each second block 901. The second block 901 includes a TG 207, a signal processing unit 208, an amplification unit 402, an AD conversion unit 403, and a memory 404 aside from a selection circuit 401.

Analog signals from the pixels are converted into digital signals by the AD conversion unit 403 via the amplification unit 402, and stored into the memory 404. The digital signals stored in the memory 404 are output to the signal processing unit 208. For example, the signal processing unit 208 performs a difference calculation between a signal of an optical black region and a signal of an effective pixel region, and addition of pixel signals. Based on the processing result, the signal processing unit 208 outputs a control signal to the TG 207. For example, the signal processing unit 208 outputs a signal for controlling the charge accumulation time (exposure time) of each pixel block. The TG 207 controls the exposure time of the pixel block by outputting signals to the horizontal block scanning circuit 902 and the vertical block scanning circuit 904 and controlling pixel driving signals PTX[Y, Z] via the selection circuit 401. For example, a first pixel block can be controlled to have a first exposure time, and a second pixel block can be controlled to have a second exposure time which is an exposure time longer than the first exposure time.

In the present exemplary embodiment, the selection circuits 401 corresponding to the pixel blocks 101 are provided in the second blocks 901 corresponding to the respective pixel blocks 101. The second blocks 901 corresponding to the respective pixel blocks 101 include circuits that can be provided on the first chip 400 or the second chip 410 other than the selection circuits 401. Examples of the circuits other than the selection circuits 401 include the amplification units 402, the AD conversion units 403, the memories 404, the TGs 207, and the signal processing units 208. By arranging the circuits other than the selection circuits 401 in the second blocks 901, the space of the first chip 400 other than the pixel blocks 101 and the space of the second chip 410 other than the second blocks 901 can advantageously be reduced for space saving.

Figure 12:
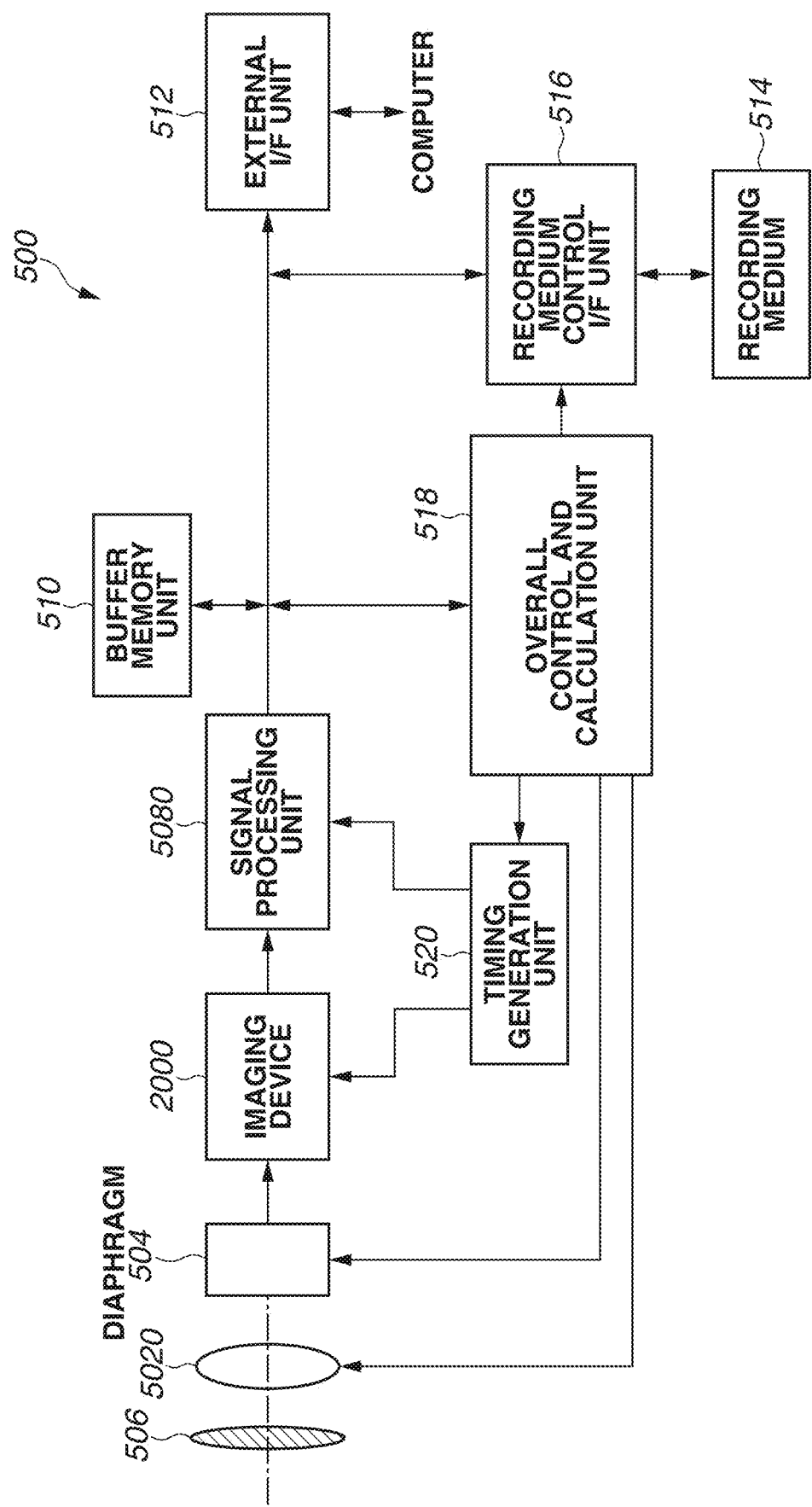
FIG. 12 is a diagram related to a fourth exemplary embodiment.

FIG. 12 is a block diagram illustrating a configuration of an imaging system 500 according to a fourth exemplary embodiment. The imaging system 500 according to the present exemplary embodiment includes an imaging device 2000 to which the configuration of any one of the foregoing imaging devices is applied. Specific examples of the imaging system 500 include a digital still camera, a digital camcorder, and a surveillance camera. The imaging system 500 includes the imaging device 2000, a lens 5020, a diaphragm 504, and a barrier 506 for protecting the lens 5020. The imaging system 500 includes a signal processing unit 5080 (also referred to as an image signal generation unit) which processes an output signal output from the imaging device 2000. The signal processing unit 5080 performs signal processing operations for performing various corrections and compressions on an input signal and outputting the resultant according to need. The signal processing unit 5080 may have a function for performing AD conversion processing on the output signal output from the imaging device 2000. The imaging system 500 further includes a buffer memory unit 510 for temporarily storing image data, and an external interface (I/F) unit 512 for communicating with an external computer. The imaging system 500 further includes a recording medium 514, such as a semiconductor memory, for recording or reading imaging data, and a recording medium control I/F unit 516 for performing recording or reading on the recording medium 514.

The imaging system 500 further includes an overall control and calculation unit 518 and a timing generation unit 520. The overall control and calculation unit 518 performs various calculations and controls the entire imaging system 500, such as digital still camera. The timing generation unit 520 outputs various timing signals to the imaging device 2000 and the signal processing unit 5080. The imaging device 2000 outputs an image signal to the signal processing unit 5080. The signal processing unit 5080 applies predetermined signal processing to the image signal output from the imaging device 2000, and outputs image data. The signal processing unit 5080 generates an image by using the image signal.

An imaging system capable of obtaining images of higher quality can be achieved by constructing the imaging system by using the imaging device 2000 that is any one of the imaging devices of the foregoing exemplary embodiments.

Figure 13A:
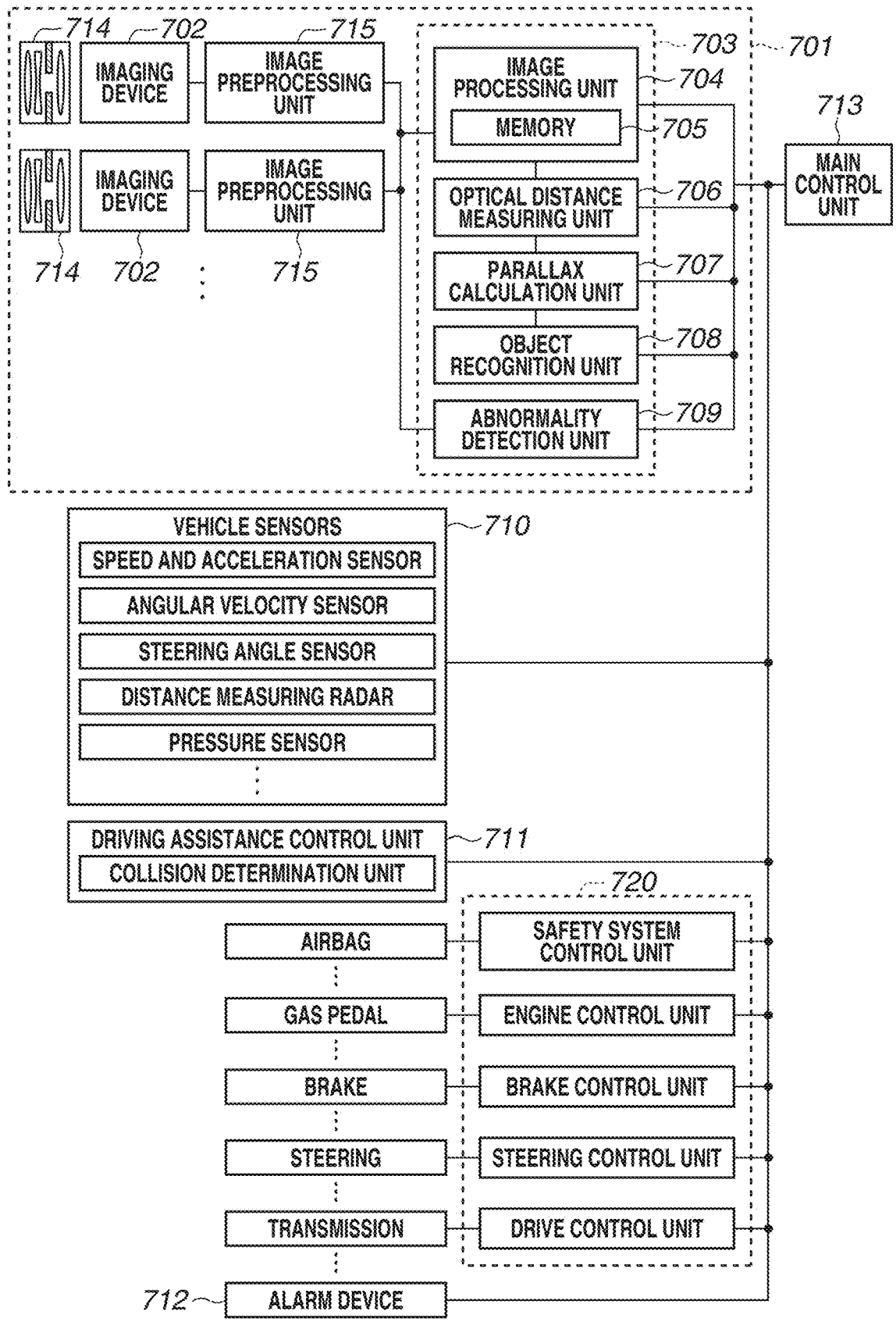

An imaging system and a moving body according to a fifth exemplary embodiment will be described with reference to FIGS. 13A and 13B. The present exemplary embodiment deals with an example of an imaging system related to an in-vehicle camera. FIGS. 13A and 13B illustrate an example of a vehicle system and an imaging system mounted thereon. An imaging system 701 includes imaging devices 702, image preprocessing units 715, an integrated circuit 703, and optical systems 714. The optical systems 714 form optical images of an object on the imaging devices 702. The imaging devices 702 convert the optical images of the object, formed by the optical systems 714, into electrical signals. The imaging devices 702 are imaging devices according to any one of the foregoing exemplary embodiments. The image preprocessing units 715 perform predetermined signal processing on the signals output from the imaging devices 702. The imaging system 701 includes at least two sets of optical systems 714, imaging devices 702, and image preprocessing units 715. The outputs from the image preprocessing units 715 of the respective sets are input to the integrated circuit 703.

The integrated circuit 703 is an integrated circuit for imaging system applications. The integrated circuit 703 includes an image processing unit 704 including a memory 705, an optical distance measuring unit 706, a parallax calculation unit 707, an object recognition unit 708, and an abnormality detection unit 709. The image processing unit 704 performs image processing, such as development processing and defect correction, on the output signals of the image preprocessing units 715. The memory 705 temporarily stores captured images and stores defect positions of imaging pixels. The optical distance measuring unit 706 performs focusing on an object and performs distance measurement. The parallax calculation unit 707 calculates a parallax (phase difference between parallax images) from a plurality of pieces of image data obtained by the plurality of imaging devices 702. The object recognition unit 708 performs recognition of objects, such as a vehicle, a road, a sign, and a person. The abnormality detection unit 709 detects an abnormality of the imaging devise 702, and notifies a main control unit 713 of the abnormality.

The integrated circuit 703 can be implemented by hardware of dedicated design, by software modules, or by a combination of these. The integrated circuit 703 can be implemented by a field programmable gate array (FPGA), an application specific integrated circuit (ASIC), or a combination of these.

The main control unit 713 governs and controls operations of the imaging system 701, vehicle sensors 710, and a control unit 720. Alternatively, the imaging system 701, the vehicle sensors 710, and the control unit 720 can individually include a communication interface, and transmit and receive control signals via the respective communication networks (for example, Controller Area Network (CAN) standard) without the provision of the main control unit 713.

The integrated circuit 703 has a function of transmitting control signals and setting values to the imaging devices 702 by receiving control signals from the main control unit 713 or according to its own control unit. For example, the integrated circuit 703 transmits settings for driving voltage switches in the imaging devices 702 by signals, and settings for switching the voltage switches frame by frame.

The imaging system 701 is connected with the vehicle sensors 710, and can detect traveling conditions of the own vehicle, such as vehicle speed, yaw rate, and steering angle, an ambient environment of the own vehicle, and states of other vehicles and obstacles. The vehicle sensors 710 also serve as a distance information acquisition unit which obtains distance information about the distance to an object from the parallax images. The imaging system 701 is also connected with a driving assistance control unit 711 which performs various driving assistance operations, such as automatic steering, automatic cruising, and a collision prevention function. In particular, for a collision determination function, the driving assistance control unit 711 makes collision estimation and determines the presence or absence of collision with another vehicle or an obstacle based on the detection results of the imaging system 701 and the vehicle sensors 710. The driving assistance control unit 711 thereby performs avoidance control if a collision is estimated to occur, or activates safety systems in the event of a collision.

The imaging system 701 is also connected with an alarm device 712 which issues an alarm to the driver based on the determination result of the collision determination unit. For example, if the determination result of the collision determination unit shows a high probability of collision, the main control unit 713 performs vehicle control for avoiding the collision or reducing damage by applying the brake, releasing the gas pedal, and/or suppressing engine output. The alarm device 712 warns the user by issuing an alarm sound, displaying alarm information on a display unit screen of a car navigation system or an instrumental panel, and/or applying vibrations to the seat belt or the steering wheel.

In the present exemplary embodiment, the imaging system 701 captures images around, e.g., in front of or behind the vehicle. FIG. 13B illustrates a layout example of the imaging system 701 in a case where the imaging system 701 captures images in front of the vehicle.

The present exemplary embodiment has described the control to avoid collision with other vehicles. However, the present exemplary embodiment is also applicable to a control for performing automatic driving to follow another vehicle, and a control for performing automatic driving to not deviate from the lane. The imaging system 701 is not limited to a vehicle like the own vehicle, and may be applied to a moving body (moving apparatus), such as a ship, an aircraft, and an industrial robot. The imaging system 701 is not limited to a moving body, either, and can be widely applied to apparatuses that use object recognition. Examples include an intelligent transportation system (ITS).

Other Exemplary Embodiments

While the exemplary embodiments have been described above, the present invention is not limited to the exemplary embodiments, and various modifications and changes may be made. The exemplary embodiments are mutually applicable, and can be implemented solely or as a combination of a plurality of the embodiments or features thereof where necessary, or where the combination of elements or features from individual embodiments in a single embodiment is beneficial.

An imaging device according to an exemplary embodiment of the present invention is directed to providing an imaging device of improved performance, compared to that of Japanese Patent Application Laid-Open No. 2012-151847.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:
1. An imaging device comprising:
   a first chip on which a plurality of first blocks is arranged in a matrix; and a second chip on which a plurality of second blocks is arranged in a matrix, the first and second chips being stacked, wherein each of the plurality of first blocks includes a plurality of pixels arranged in a matrix, wherein each of the plurality of second blocks includes a selection circuit configured to select driving timing of the plurality of pixels corresponding to one of the plurality of first blocks, and wherein the selection circuit in each of the plurality of second blocks overlaps with the one of the plurality of first blocks in a plan view, wherein the selection circuit is configured to select the driving timing given to the plurality of pixels so that exposure time of one of the plurality of first blocks is different from that of another of the plurality of first blocks, wherein the one of the plurality of first blocks includes a first pixel arranged in a first row of a plurality of pixel rows and a second pixel arranged in a second row of the plurality of pixel rows, and the another of the plurality of first blocks includes a third pixel arranged in a third row of the plurality of pixel rows and a fourth pixel arranged in a fourth row of the plurality of pixel rows, wherein the imaging device includes a plurality of signal lines corresponding to a plurality of rows, wherein the plurality of signal lines includes a first signal line that controls a row transfer pulse signal for controlling the driving timing of the first pixel, a second signal line that controls a row transfer pulse signal for controlling the driving timing of the second pixel, a third signal line that controls a row transfer pulse signal for controlling the driving timing of the third pixel, and a fourth signal line that controls a row transfer pulse signal for controlling the driving timing of the fourth pixel, wherein in a case where the one of the plurality of first blocks is a short time exposure block and the another of the plurality of first blocks is a long time exposure block, the row transfer pulse signal for controlling the driving timing of the third pixel is input via the third signal line and charge accumulation of the third pixel is started, subsequently, the row transfer pulse signal for controlling the driving timing of the fourth pixel is input via the fourth signal line and charge accumulation of the fourth pixel is started, subsequently, the row transfer pulse signal for controlling the driving timing of the first pixel is input via the first signal line and charge accumulation of the first pixel is started, subsequently, the row transfer pulse signal for controlling the driving timing of the second pixel is input via the second signal line and charge accumulation of the second pixel is started, subsequently, the row transfer pulse signal for controlling the driving timing of the first pixel is input via the first signal line and the charge accumulation of the first pixel is ended, subsequently, the row transfer pulse signal for controlling the driving timing of the second pixel is input via the second signal line and the charge accumulation of the second pixel is ended, subsequently, the row transfer pulse signal for controlling the driving timing of the third pixel is input via the third signal line and the charge accumulation of the third pixel is ended, and subsequently, the row transfer pulse signal for controlling the driving timing of the fourth pixel is input via the fourth signal line and the charge accumulation of the fourth pixel is ended.

2. The imaging device according to claim 1, wherein each of the plurality of second blocks includes a signal processing unit configured to process signals output from the plurality of pixels.

3. The imaging device according to claim 1, further comprising:
a first block scanning circuit, the first block scanning circuit being for outputting a vertical block control signal for controlling the driving timing of the plurality of pixels arranged in the plurality of rows; and
a second block scanning circuit, the second block scanning circuit being for outputting a horizontal block control signal for controlling the driving timing of the plurality of pixels arranged in the plurality of columns,
wherein the selection circuit is for selecting the driving timing of the plurality of pixels based on a combination of the vertical block control signal and the horizontal block control signal.

4. The imaging device according to claim 3, wherein the selection circuit is for selecting the driving timing of the plurality of pixels by generating a pixel transfer pulse signal from the row transfer pulse signal of one of the first row, the second row, the third row, and the fourth row, based on the combination of the vertical block control signal and the horizontal block control signal.

5. The imaging device according to claim 4,
wherein the pixels each include a transfer transistor for transferring a charge from a photoelectric conversion unit, and
wherein the pixel transfer pulse signal is input to a gate of the transfer transistor.

6. The imaging device according to claim 5, wherein the first block scanning circuit has a function of a first scanning circuit for outputting the row transfer pulse of one of the first row, the second row, the third row, and the fourth row.

7. The imaging device according to claim 1, wherein the selection circuit is for giving common driving timing to a plurality of pixels belonging to the same row of the first block.

8. The imaging device according to claim 2, wherein the signal processing unit is analog-to-digital (AD) conversion unit for converting an analog signal output from the pixels into a digital signal.

9. The imaging device according to claim 2, wherein the signal processing unit is a signal processing unit for processing a digital signal output from the pixels.

10. The imaging device according to claim 2,
wherein the signal processing unit is for processing a signal output from a first pixel arranged in one of the first blocks and a signal output from a second pixel arranged in another of the first blocks, and
wherein the selection circuit is for selecting the driving timing given to the plurality of pixels based on a result of the signal processing unit so that exposure time of the one first block is different from that of the another first block.

11. The imaging device according to claim 1, wherein:
the selection circuit includes a first logic circuit and a plurality of second logic circuits corresponding to the plurality of rows of the first block;
the first logic circuit outputs a signal based on the combination of the vertical block control signal and the horizontal block control signal; and the output signal from the first logic circuit is input to the plurality of the second logic circuits.

12. The imaging device according to claim 11, further comprising a reading signal line, wherein a reading signal from the reading signal line is input to the first logic circuit, and wherein an output signal is based on the reading signal and the signal based on the combination of the vertical block control signal and the horizontal block control signal, and is input from the first logic circuit to the second logic circuit.

13. The imaging device according to claim 11, wherein:
the signal from the first logic circuit is input to the plurality of second logic circuits; and
the row transfer pulses from the plurality of signal lines are individually input to the plurality of second logic circuits.

14. The imaging device according to claim 10, wherein some of the plurality of pixels included in the first block are used for thinning-out reading.

15. An imaging system comprising:
the imaging device according to claim 1; and
an image signal generation circuit for generating an image by processing a signal output from the imaging device.

16. A moving body comprising:
the imaging device according to claim 1; and
a distance information acquisition circuit for acquiring distance information about distance to an object based on a signal from the imaging device,
wherein the moving body further comprises control circuit for controlling the moving body based on the distance information.

* * * * *